United States Patent
Rosenblatt et al.

(10) Patent No.: US 10,580,772 B2
(45) Date of Patent: *Mar. 3, 2020

(54) TWO DIMENSION MATERIAL FIN SIDEWALL

(71) Applicant: Interantional Business Machines Corporation, Armonk, NY (US)

(72) Inventors: Sami Rosenblatt, White Plains, NY (US); Rasit O. Topaloglu, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 16/051,820

(22) Filed: Aug. 1, 2018

(65) Prior Publication Data

US 2018/0342510 A1 Nov. 29, 2018

Related U.S. Application Data

(63) Continuation of application No. 15/799,247, filed on Oct. 31, 2017, now Pat. No. 10,103,144, which is a
(Continued)

(51) Int. Cl.
*H01L 27/088* (2006.01)
*H01L 21/8234* (2006.01)
(Continued)

(52) U.S. Cl.
CPC .... *H01L 27/0886* (2013.01); *H01L 21/02378* (2013.01); *H01L 21/02527* (2013.01);
(Continued)

(58) Field of Classification Search
CPC ........ H01L 21/02378; H01L 21/02387; H01L 21/02527; H01L 21/31055;
(Continued)

(56) References Cited

U.S. PATENT DOCUMENTS 6,255,191 B1 7/2001 Gau et al.
8,456,902 B2 6/2013 Kioussis et al.
(Continued)

OTHER PUBLICATIONS

Klekachev, Alexander V., et al. "Graphene transistors and photodetectors," Electrochemical Society Interface 22.1 (2013): 63-68.
(Continued)

*Primary Examiner* — Yosef Gebreyesus
(74) *Attorney, Agent, or Firm* — Zip Group PLLC

(57) ABSTRACT

A semiconductor structure includes fins that have a 2D material, such as Graphene, upon at least the fin sidewalls. The thickness of the 2D material sidewall may be tuned to achieve desired finFET band gap control. Neighboring fins of the semiconductor structure form fin wells. The semiconductor structure may include a fin cap upon each fin and the 2D material is formed upon the sidewalls of the fin and the bottom surface of the fin wells. The semiconductor structure may include a well-plug at the bottom of the fin wells and the 2D material is formed upon the sidewalls and upper surface of the fins. The semiconductor structure may include both fin caps and well-plugs such that the 2D material is formed upon the sidewalls of the fins.

20 Claims, 15 Drawing Sheets

Related U.S. Application Data continuation of application No. 15/489,920, filed on Apr. 18, 2017, now Pat. No. 9,947,660.

(51) Int. Cl.

| | | |
|---|---|---|
| *H01L 29/16* | (2006.01) | |
| *H01L 29/51* | (2006.01) | |
| *H01L 29/165* | (2006.01) | |
| *H01L 21/762* | (2006.01) | |
| *H01L 29/06* | (2006.01) | |
| *H01L 21/02* | (2006.01) | |
| *H01L 21/82* | (2006.01) | |
| *H01L 21/8238* | (2006.01) | |
| *H01L 21/3105* | (2006.01) | |

(52) U.S. Cl.
CPC .. *H01L 21/31055* (2013.01); *H01L 21/76224* (2013.01); *H01L 21/8213* (2013.01); *H01L 21/823431* (2013.01); *H01L 21/823871* (2013.01); *H01L 29/0649* (2013.01); *H01L 29/165* (2013.01); *H01L 29/1606* (2013.01); *H01L 29/1608* (2013.01); *H01L 29/517* (2013.01)

(58) Field of Classification Search
CPC ........... H01L 21/76224; H01L 21/8213; H01L 21/823431; H01L 21/823871; H01L 27/0886; H01L 29/0649; H01L 29/1606; H01L 29/1608; H01L 29/165; H01L 29/517

See application file for complete search history.

(56) References Cited

U.S. PATENT DOCUMENTS

| | | | |
|---|---|---|---|
| 8,716,863 B2 | 5/2014 | Wann et al. | |
| 8,815,739 B2 | 8/2014 | Krivokapic et al. | |
| 8,952,258 B2 | 2/2015 | Plucinski et al. | |
| 8,957,405 B2 | 2/2015 | Adkisson et al. | |
| 9,070,677 B2 | 6/2015 | Park et al. | |
| 9,171,907 B2 | 10/2015 | de Heer et al. | |
| 9,240,478 B2 | 1/2016 | Chang et al. | |
| 9,330,970 B2 | 5/2016 | Warn et al. | |
| 9,419,137 B1 | 8/2016 | Bello et al. | |
| 9,437,716 B2 | 9/2016 | Wada et al. | |
| 9,935,102 B1 * | 4/2018 | Bi | H01L 27/0886 |
| 9,947,660 B1 | 4/2018 | Rosenblatt et al. | |
| 10,103,144 B1 * | 10/2018 | Rosenblatt | H01L 27/0886 |
| 2010/0055388 A1 | 3/2010 | Chen et al. | |
| 2015/0171084 A1 | 6/2015 | Lin et al. | |
| 2015/0303299 A1 | 10/2015 | Chang et al. | |
| 2015/0364592 A1 | 12/2015 | van Dal et al. | |
| 2016/0118479 A1 | 4/2016 | Chang et al. | |
| 2016/0284586 A1 | 9/2016 | Alptekin et al. | |
| 2018/0006031 A1 * | 1/2018 | Zhou | H01L 29/785 |

OTHER PUBLICATIONS

Schwierz, Frank. "Graphene Transistors," Nature nanotechnology 5.7 (2010): 487-496.

Xia, Fengnian, et al. "Graphene field-effect transistors with high on/off current ratio and large transport band gap at room temperature," Nano letters 10.2 (2010): 715-718.

Chen, Zhihong, et al. "Graphene Nano-Ribbon Electronics," Physica E: Low-dimensional Systems and Nanostructures, vol. 40/2, pp. 228-232 (2007).

Hwang, Wan Sik, "Fabrication of top-gated epitaxial graphene nanoribbon FETs using hydrogen-silsesquioxane," Journal of Vacuum Science & Technology, Mar. 12, 2012.

Palecchi, E., "High Electron Mobility in Epitaxial Graphene on 4H-SiC(0001) via post-growth Annealing Under Hydrogen," Published Apr. 2, 2014.

Lin, Yu-Ming, "Enhanced Performance in Epitaxial Graphene FETs With Optimized Channel Morphology," IEEE Electron Device Letters, vol. 32, No. 10, Oct. 2011.

Goykhman, Ilya, "On-Chip Integrated, Silicon-Graphene Plasmonic Schottky Photodetector with High Responsivity and Avalanche Photogain" 2016.

Nayfeh, Osama M., "Impact of Plasma-Assisted Atomic Layer Deposited Gate Dielectric on Graphene Transistors," IEEE Electron Device Letters, vol. 32, No. 4, Apr. 2011.

List of IBM Patents or Patent Applications Treated as Related, dated herewith.

* cited by examiner

TWO DIMENSION MATERIAL FIN SIDEWALL

BACKGROUND

Field of the Invention

The present invention generally relates to integrated circuits, and more particularly to fin field effect transistors (finFETs) that include fins having a two dimension (2D) material sidewall.

Background of Invention

A complementary metal oxide semiconductor (CMOS) device uses symmetrically-oriented pairs of p-type and n-type metal oxide semiconductor field effect transistors (MOSFETs) arranged on silicon or silicon-on-insulator (SOI) substrates. Source and drain regions associated with the MOSFET are connected by a channel. A gate disposed over the channel controls the flow of current between the source and drain regions. The source region, channel, and drain region may be defined by a fin that provides more than one surface through which the gate controls the flow of current, thereby making the MOSFET a "finFET" device.

A 2D material is a crystalline material consisting of a single layer of atoms. Graphene, a particular type of 2D material, is an allotrope of carbon in the form of a two-dimensional, atomic-scale, hexagonal lattice in which one atom forms each vertex.

SUMMARY

According to one embodiment of the present invention, a semiconductor structure fabrication method is presented. The method includes forming a first fin and a second fin within a semiconductor substrate. The first fin and the second fin are separated by a fin well. The fin well includes a first sidewall formed by the first fin, a second sidewall formed by the second fin, and a bottom surface formed by the semiconductor substrate. The method further includes forming a first fin cap upon the first fin and a second fin cap upon the second fin. The method further includes forming a 2D material upon the first sidewall formed by the first fin, upon the second sidewall formed by the second fin, and upon the bottom surface formed by the semiconductor substrate.

In another embodiment of the present invention, a semiconductor structure is presented. The structure includes a semiconductor substrate. The structure further includes a first fin and a second fin within the semiconductor substrate. The first fin and the second fin are separated by a fin well. The fin well includes a first sidewall formed by the first fin, a second sidewall formed by the second fin, and a bottom surface formed by the semiconductor substrate. The structure further includes a first fin cap upon the first fin and a second fin cap upon the second fin. The structure further includes a 2D material upon the first sidewall formed by the first fin, upon the second sidewall formed by the second fin, and upon the bottom surface formed by the semiconductor substrate.

In yet another embodiment of the present invention, a finFET is presented. The finFET includes a semiconductor substrate. The finFET further includes a first fin and a second fin within the semiconductor substrate. The first fin and the second fin are separated by a fin well. The fin well includes a first sidewall formed by the first fin, a second sidewall formed by the second fin, and a bottom surface formed by the semiconductor substrate. The finFET further includes a first fin cap upon the first fin and a second fin cap upon the second fin. The finFET further includes a 2D material upon the first sidewall formed by the first fin, upon the second sidewall formed by the second fin, and upon the bottom surface formed by the semiconductor substrate.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

Embodiments of the invention relate to the fabrication of finFET devices and more particularly, to a device with a fin that has a 2D material sidewall. Generally, as the width of the 2D material sidewall increases, the band gap decreases. This is the result of the physical constriction of conduction channels in a semiconductor (for example, in nanowires, 2D Electron-Gas, etc.). Additionally, the thickness of the 2D material sidewall may establish the existence of a band gap. Monolayer Graphene does not have a band gap unless it is mechanically strained, submitted to a strong perpendicular electric field, chemically doped, or is constricted as in this invention. Bilayer Graphene, on the other hand, does have a band gap in its pristine state even without a constriction. Band gaps of up to 300 meV may be obtained in monolayer Graphene using constrictions alone.

It should be noted that some of the drawings represent views of a semiconductor structure, such as a wafer, IC chip, etc. The particular view depicted is chosen to depict such features of the embodiments. Some of the drawings, depict multiple views. In such drawings, the particular view is denoted, e.g., cross section view along the bisector of the gate, top view, and side cross section view perpendicular to the gate between fins.

Figure 1:
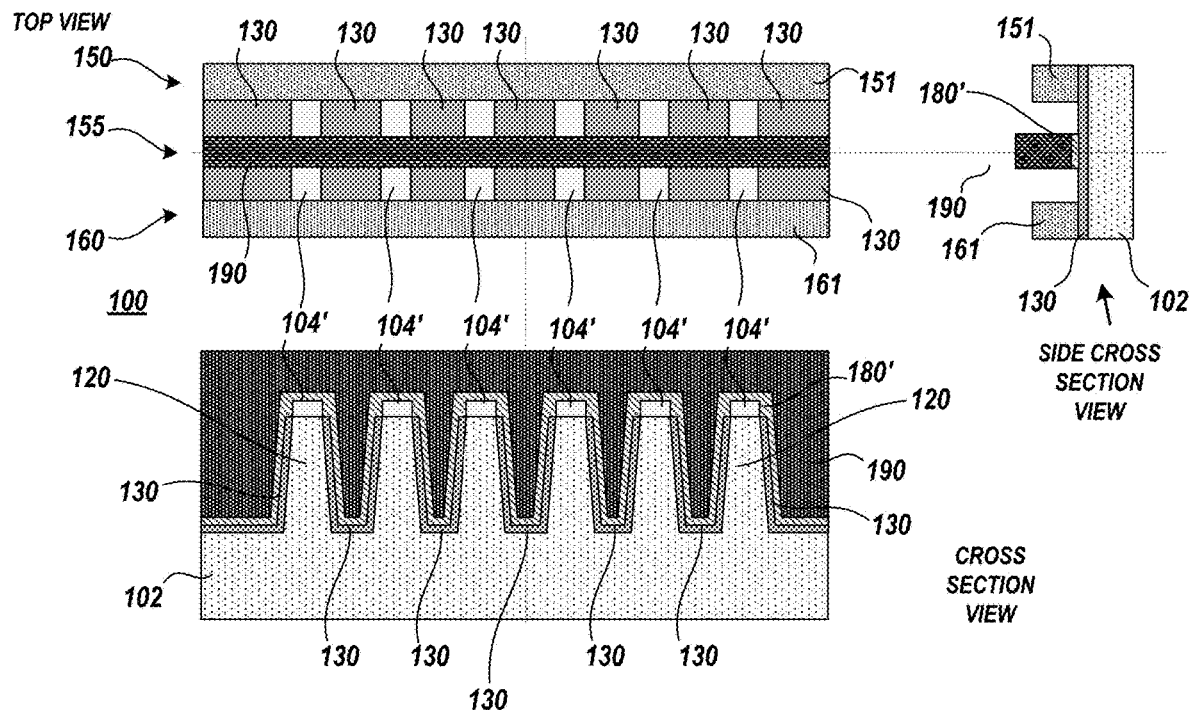
FIG. 1 illustrates a semiconductor structure that includes a fin having 2D material sidewalls, according to one or more exemplary embodiments of the present invention.

Referring now to FIG. 1, an exemplary semiconductor structure 100, such as a wafer, IC chip, etc., includes a silicon carbide (SiC) substrate 102, fins 120 formed from the SiC substrate 102, a fin cap 104' upon the top of each fin 120, a 2D layer 130 upon the sidewalls of fins 120 and upon bottom of the fin well upon substrate 102 between fins 120, a source contact 151 that is formed upon the 2D layer 130 and upon the fin caps 104' within source region 150, a drain contact 161 that is formed upon the 2D layer 130 and upon the fin caps 104' within drain region 160, a gate dielectric 180' upon the 2D layer 130 and upon the fin caps 104' within channel region 155, and a gate 190 upon the gate dielectric 180'.

The width of 2D layer 130 and the height of the fin 120 may be adjusted to achieve desired band gap properties. In an embodiment, the width of the 2D layer is defined by the fin spacing plus two times the fin height up to the fin cap 104'.

Figure 2A:
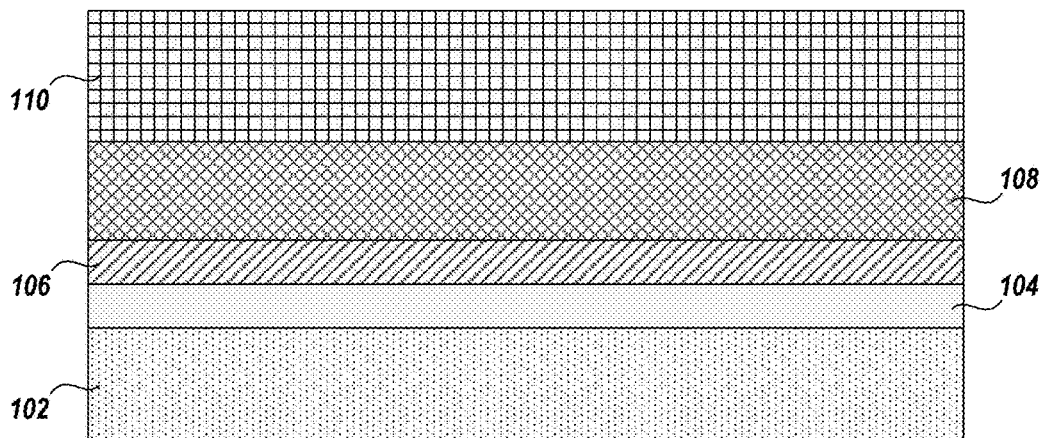
FIG. 2A-FIG. 12 illustrates fabrication stages of a semiconductor structure that includes a fin having 2D material sidewalls, according to exemplary embodiments of the present invention.

Referring now to FIG. 2A, depicting semiconductor structure 100 at an exemplary initial fabrication stage. At this fabrication stage, a fin cap layer 104 is formed upon SiC substrate 102, a mandrel base layer 106 is formed upon fin cap layer 104, a mandrel layer 108 is formed upon the mandrel base layer 106, and a lithography layer(s) 110 is formed upon the mandrel layer 108.

SiC substrate 102 is a Silicon Carbide substrate and may be about, but is not limited to, several hundred microns thick. For example, the substrate 102 has a thickness ranging from about 700 nm to about 700 um. In one embodiment, the substrate 102 may have a thickness ranging from about 400 um to about 700 um.

Fin cap layer 104 is formed from a material which a particular 2D material is not formed upon during a subsequent carbide formation fabrication stage further described below. In a particular embodiment, fin cap layer 104 may be formed by depositing Silicon Nitride upon the substrate 102. The fin cap layer 104 has a thickness ranging from about 5 nm to about 200 nm. In one embodiment, the fin cap layer 104 may have a thickness ranging from about 5 nm to about 50 nm.

Mandrel base layer 106 is formed from a material which a mandrel may be fabricated thereupon during a subsequent fabrication stage further described below. In a particular embodiment, mandrel base layer 106 is formed from undoped silicon glass (USG). Mandrel base layer 106 has a thickness ranging from about 5 nm to about 200 nm. In one embodiment, the mandrel base layer 106 may have a thickness ranging from about 20 nm to about 200 nm.

Mandrel layer 108 is formed from a material that which may be selectively removed so that remaining portions thereof form mandrels. In a particular embodiment, mandrel layer 108 is formed from amorphous Silicon Carbide. Mandrel layer 108 has a thickness ranging from about 50 nm to about 200 nm. In one embodiment, the mandrel layer 108 may have a thickness ranging from about 20 nm to about 200 nm.

Lithography layer(s) 110 are formed from one or more material layers used to selectively remove portions of mandrel layer 108 and to retain portions of mandrel layer 108. In a particular embodiment, lithography layers 110 include an optical dense layer, a SiC layer, an anti-reflective layer, and a photoresist layer. Such lithograph layer(s) 110 may be patterned, as is known in the art, in order to expose portions of the underlying mandrel layer 108 so that some portions of mandrel layer 108 may be subsequently removed and other portions of mandrel layer 108 may be retained.

Figure 2B:
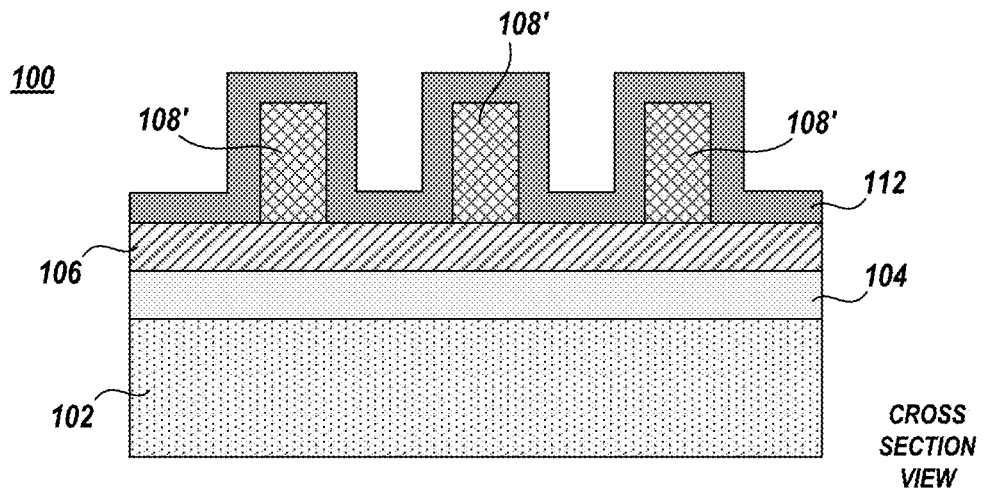

Referring now to FIG. 2B, depicting semiconductor structure 100 at an intermediate fabrication stage. At this fabrication stage, mandrels 108' are formed from mandrel layer 108 and a spacer layer 112 is formed upon the mandrel base layer 106 and the mandrels 108'. The removal of portions of mandrel layer 108 and retention of mandrels 108' from mandrel layer 108 may be achieved by known subtractive etching techniques. For example, an etchant chosen to remove the material of mandrel layer 108 and to stop at the mandrel base layer 106 may be used to, for instance, remove portions of mandrel layer 108 that are exposed by the developing/patterning of the lithograph layer(s) 110. For clarity, unless otherwise required, mandrels 108' may be formed by other fabrication techniques without deviating from those embodiments herein claimed. Furthermore, subsequent to their formation, mandrels 108' may undergo further fabrication processing stages in order to achieve appropriate functions desired of mandrels 108.

Spacer layer 112 is formed from one or more materials that are selective to an etchant that removes mandrels 108' and that mask an etchant from removing material of the mandrel base layer 106 and fin cap layer 104 during a subsequent fabrication stage further described below. In a particular embodiment, spacer layer 112 is formed by depositing Silicon Oxide upon the mandrel base layer 106 and upon mandrels 108'. Spacer layer 112 has a thickness ranging from about 10 nm to about 100 nm. In one embodiment, the spacer layer 112 may have a thickness ranging from about 50 nm to about 100 nm.

Figure 3:
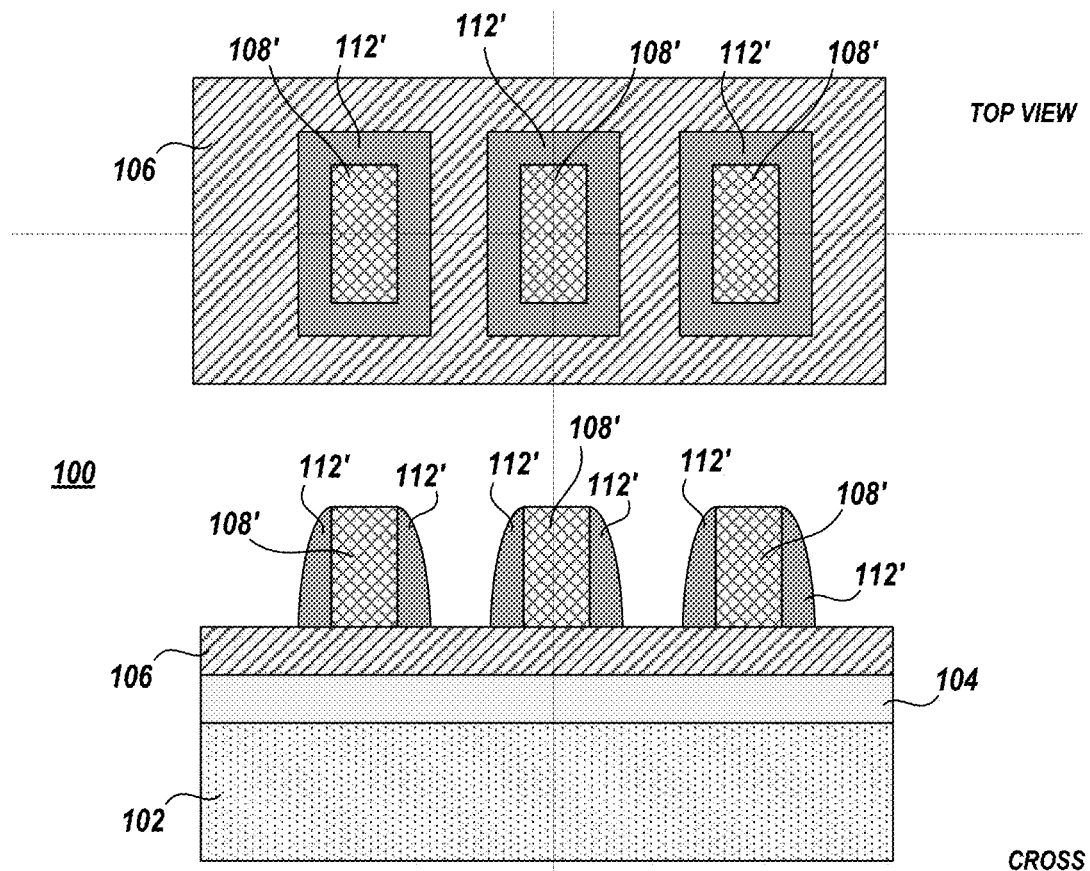

Referring now to FIG. 3, depicting semiconductor structure 100 at an intermediate fabrication stage. At the present fabrication stage, spacers 112' are formed from spacer layer 112. Spacers 112' are generally formed by retaining the spacer layer 112 material on the sidewalls of mandrels 108' and by removing the undesired other portions of spacer layer 112 material not upon the sidewalls of mandrels 108'. Additional selective removal techniques to form spacers 112' upon the sidewalls of mandrels 108' are generally known in the art.

Figure 4:
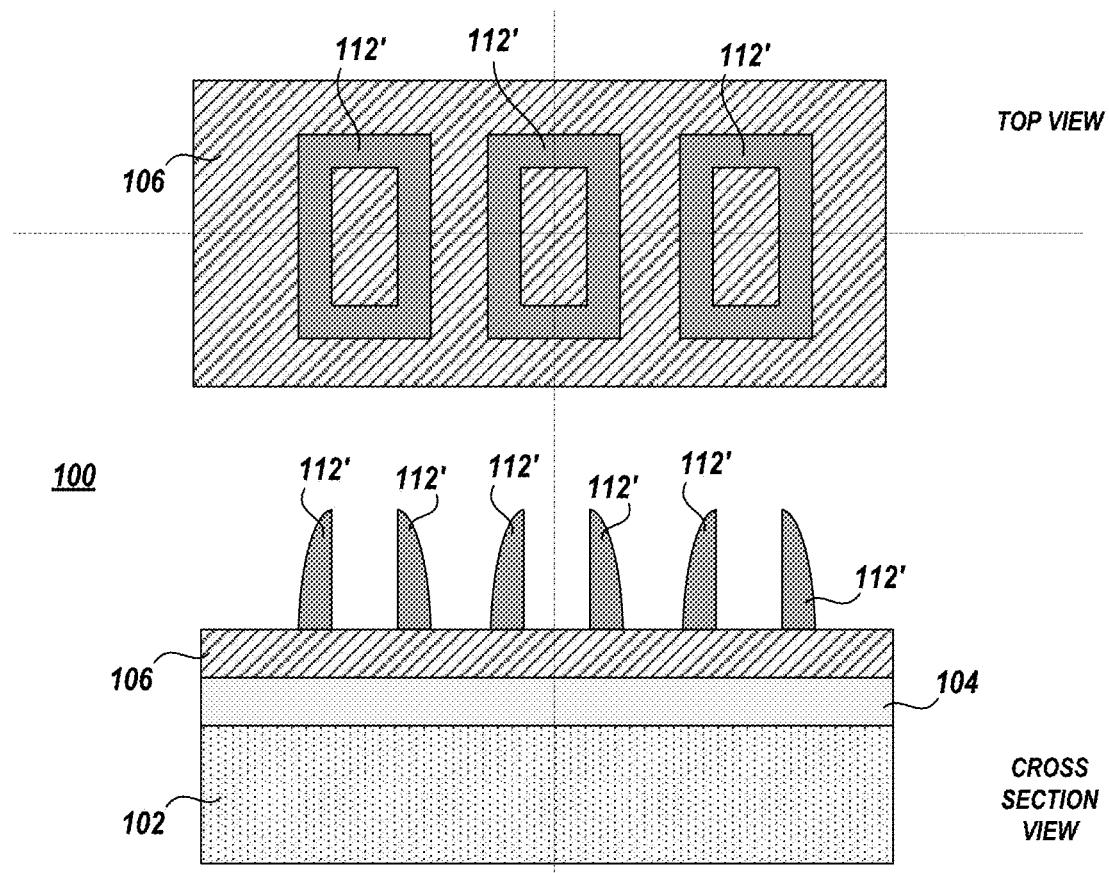

Referring now to FIG. 4, depicting semiconductor structure 100 at an intermediate fabrication stage. At the present fabrication stage, spacers 112' are retained upon mandrel base layer 106 and mandrels 108' are removed. The removal of mandrels 108' may be achieved by subtractive etching techniques where an etchant selectively removes only the materials of mandrels 108' and does not remove the material of spacers 112' or mandrel base layer 106.

The removal of mandrels 108' and the retention of spacers 112' generally form an array of spacers 112' across the surface of mandrel base layer 106, as is exemplary shown in the lower view of FIG. 4. As such, portions of mandrel base layer 106 are exposed (i.e. there is no spacer 112' there above) and other portions of mandrel base layer 106 are covered (i.e. there is a spacer 112' there above).

Figure 5:
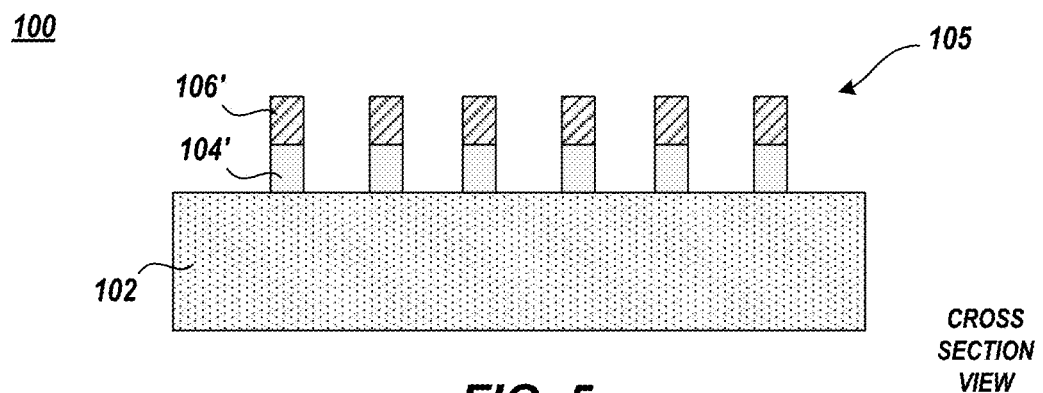

Referring now to FIG. 5, depicting semiconductor structure 100 at an intermediate fabrication stage. At the present fabrication stage, fin mask 105 is formed from mandrel base layer 106 and fin cap layer 104. Fin mask 105 includes a retained portion 106' of mandrel base layer 106 that was previously covered (i.e. there was a spacer 112' there above) and includes a retained portion 104' of fin cap layer 104 below the portion 106'. Fin mask 105 may be formed by removing the spacers 112' and the exposed portions of mandrel base layer 106. Additional selective removal techniques to form fin mask 105 are generally known in the art.

Fin mask 105 generally masks portions of substrate 102. Fin mask 105 does not cover exposed portions of substrate 102 (i.e. there is no fin mask 105 there above) and fin mask 105 covers other portions of substrate 102 (i.e. there is a fin mask 105 there above).

Figure 6:
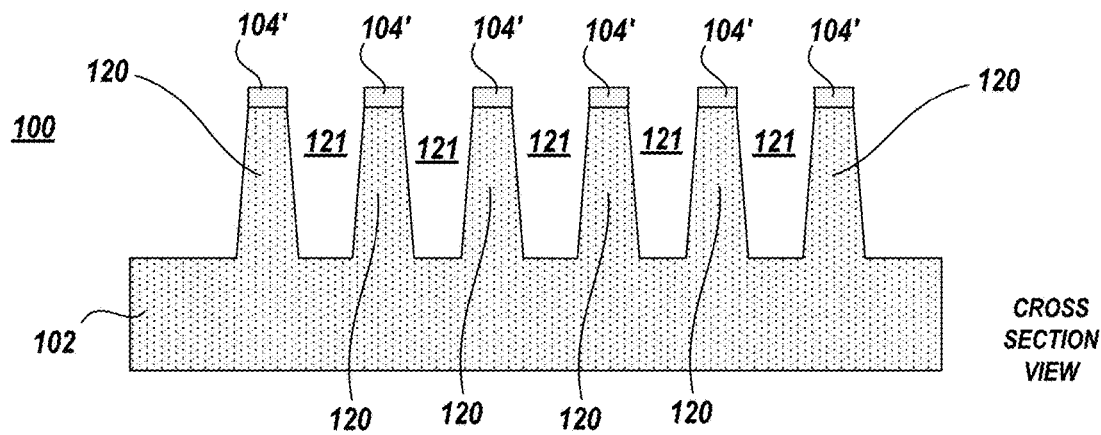

Referring now to FIG. 6, depicting semiconductor structure 100 at an intermediate fabrication stage. At the present fabrication stage, fin structures are formed. Each fin structure includes a fin 120 formed from substrate 102 and includes a retained portion 104', referred to as a fin cap 104', upon the fin 120. The fin structures may be formed by removing fin mask 105 and partially removing the exposed portions of substrate 102. Additional selective removal techniques to form fin structures are generally known in the art.

The partial removal of exposed portions of substrate 102 results in a fin well 121 existing between neighboring fins 120. Each fin well 121 includes a fin sidewall of a left fin 120, a fin sidewall from a right fin 120 neighboring the left fin 120, and a bottom well surface that connects the aforementioned sidewalls.

Figure 7:
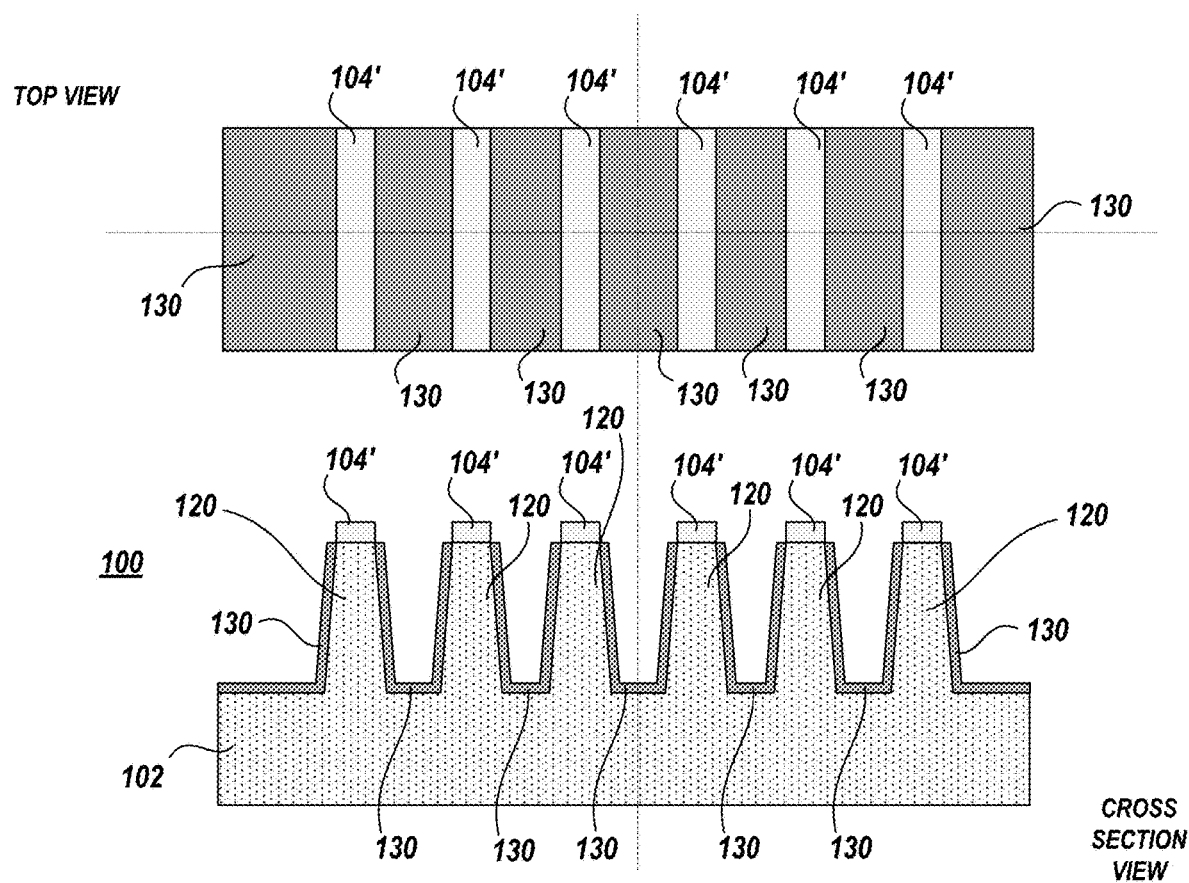

Referring now to FIG. 7, depicting semiconductor structure 100 at an intermediate fabrication stage. At the present fabrication stage, 2D layer 130 is formed within the fin wells 121 by forming a 2D material upon the exposed surfaces of substrate 102. In embodiments, the particular deposition techniques may be selected to achieve desired thickness of 2D layer 130 in order to control finFET band gap properties. For example, Ar gas is used to achieve slower sublimation of Si from the SiC surface at high temperatures (e.g., 750° C., or the like) to achieve a few monolayers of Graphene in a controlled manner (each Graphene monolayer is about 0.35 nm thick).

Generally, a 2D material is a crystalline material consisting of a single layer of atoms. In some embodiments, a thickness of the 2D layer 130 has a thickness of about 0.6 nm to about 3 nm, such as about 0.6 nm. 2D layer 130 has a thickness ranging from about 0.2 nm to about 5 nm. In one embodiment, the 2D layer 130 may have a thickness ranging from about 0.35 nm to about 3.5 nm.

2D layer 130 will act as a layer in which the source region 150 drain region 160 and channel region 155 are formed. Suitable materials include, for example, graphene, TMDs, BN, or the like. Generally, a thin layer such as one or a few monolayers of a 2D material is deposited. Examples of suitable TMDs include MoO3 MoS2, WS2, WSe2, MoSe2, MoTe2, and the like.

In some embodiments one or a few monolayers of graphene, a TMD, BN or the like is formed using, for example, chemical vapor deposition (CVD), atmospheric pressure CVD (APCVD), low-pressure CVD (LPCVD) at a sub-atmospheric pressure, plasma enhanced CVD (PECVD), atomic layer CVD (ALCVD), or combinations thereof. For example, a graphene layer may be formed using $CH_4+H_2+Ar$.

Figure 8:
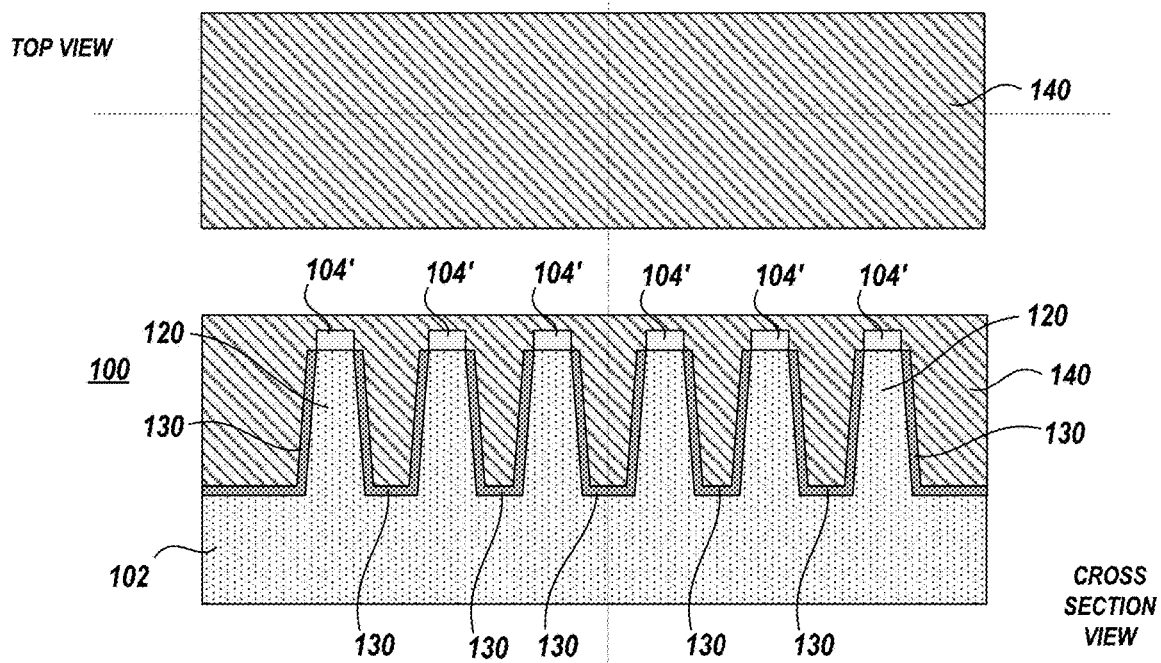

Referring now to FIG. 8, depicting semiconductor structure 100 at an intermediate fabrication stage. At the present fabrication stage, blanket layer 140 is formed upon the 2D layer 130 and upon the fin caps 104'. Blanket layer 140 is formed from a material that may be etched from structure 100 without damage to the underlying 2D layer 130 and without damage to the fin caps 104'. For example, the blanket layer 140 may be a negative tone resist such as KemLab 1600, a positive tone resist with a lift-off resist underlayer such as LOR or PMGI, or an image reversal resist such AZ 5215E photoresist, or the like. In an embodiment, the blanket layer 140 may be formed to a thickness greater than the height of the fin structures such that the blanket layer 140 covers the fin caps 104'.

Figure 9:
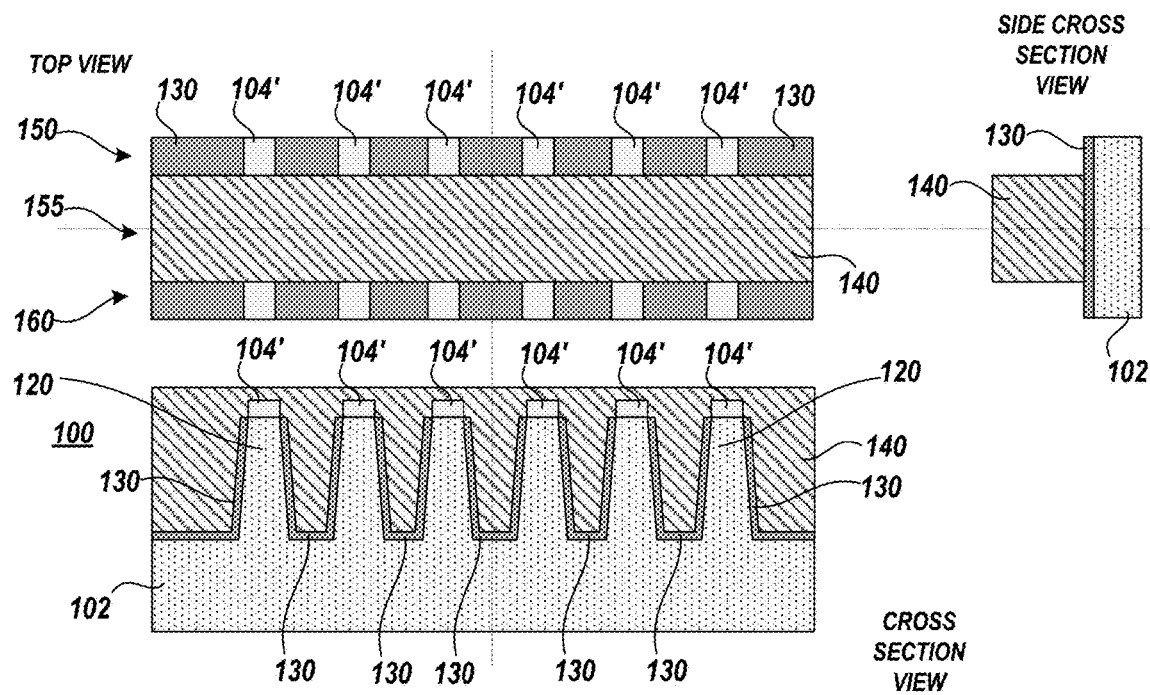

Referring now to FIG. 9, depicting semiconductor structure 100 at an intermediate fabrication stage. At the present fabrication stage, portions of blanket layer 140 within source region 150 and within drain region 160 are removed. The removal of portions of blanket layer 140 may be achieved by lithography of the 140 photoresist or ebeam resist and subsequent development. The developer removes the material of blanket layer 140 from the source region 150 and from drain region 160 while retaining the 2D layer 130 and fin caps 104' within the source region 150 and within the drain region 160, while also retaining the blanket layer 140 material in channel region 155. The blanket layer 140 that remains in channel region 155 may be herein referred to as channel mask 140. Additional lithographic techniques to achieve selective removal of portions of blanket layer 140 are generally known in the art.

Figure 10:
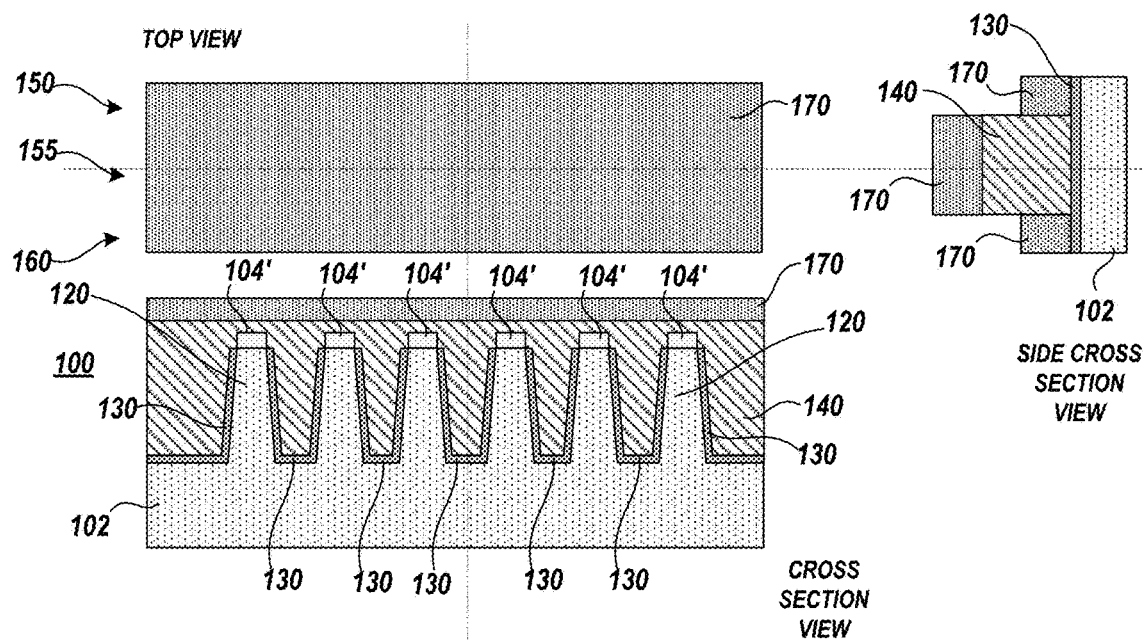

Referring now to FIG. 10, depicting semiconductor structure 100 at an intermediate fabrication stage. At the present fabrication stage, source/drain layer 170 is formed upon top surface of the retained blanket layer 140 in channel region 155 and upon the 2D layer 130 and upon the fin caps 104' within source region 150 and within drain region 160. Source/drain layer 170 is formed from a material that may be desired to form a source contact and a drain contact. For example, the source/drain layer 170 may be Pd, Au (with Cr adhesion layer), Pt, or the like. Subsequently, a liftoff process is realized in which a solvent such as Microposit Remover 1165 or acetone removes the remaining retained blanket layer 140 and leaves behind source/drain layer 170 only in the regions that it does not cover 140. In other words, the liftoff process removes the retained blanket layer 140 and portion of the source/drain layer 170 which is thereupon.

Figure 11:
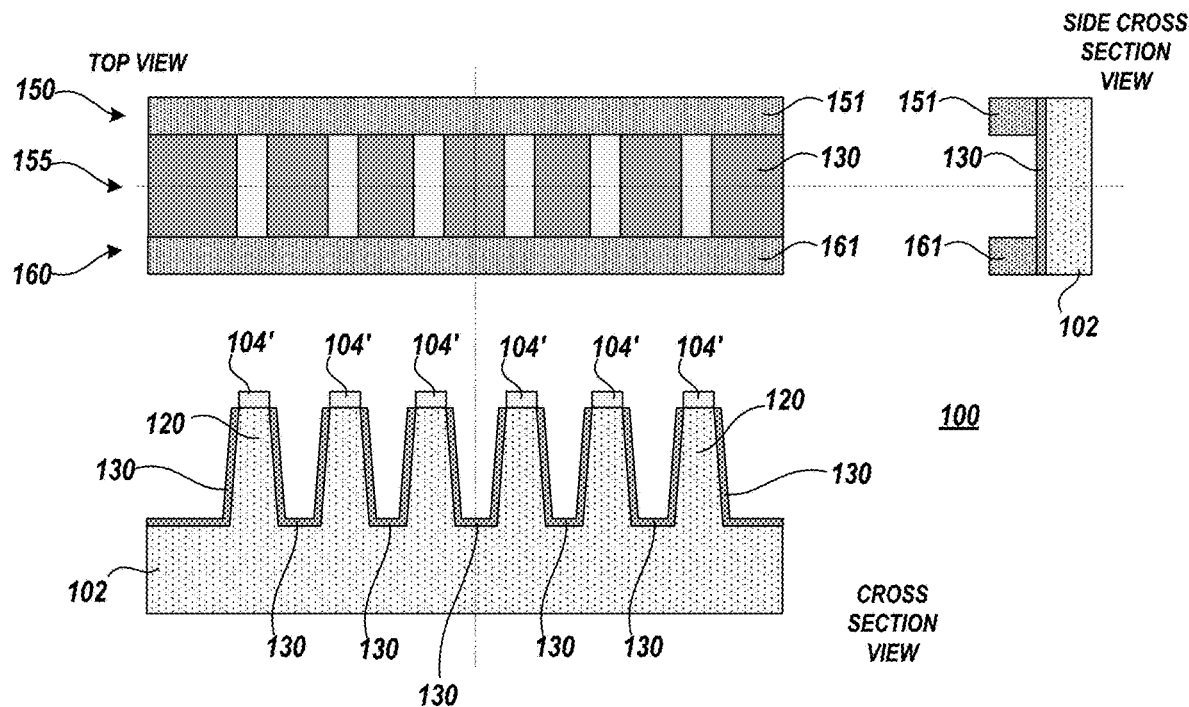

Referring now to FIG. 11, depicting semiconductor structure 100 at an intermediate fabrication stage. At the present fabrication stage, the remaining blanket layer 140 within channel region 155 is removed by the liftoff process, source contact 151 is formed, and drain contact 161 is formed. The removal of blanket layer 140 may be achieved by a liftoff technique where a solvent such as Microposit Remover 1165 or acetone removes the material of blanket layer 140 from the channel region 155, thus also taking away the above source/drain layer 170 material thereupon, while retaining the source/drain layer 170 material within source region 150 and within drain region 160. Liftoff techniques to achieve selective removal of the blanket layer 140 within channel region 150, and the source/drain layer 170 there above, are generally known in the art.

Generally, the source/drain layer 170 material that remains within source region 150 and within drain region 160, subsequent to the removal of source/drain layer 170 material from channel region 155, forms source contact 151 and drain contact 161, respectively. Further fabrication steps may be utilized to form the desired geometry of source contact 151 and drain contact 161.

Figure 12:
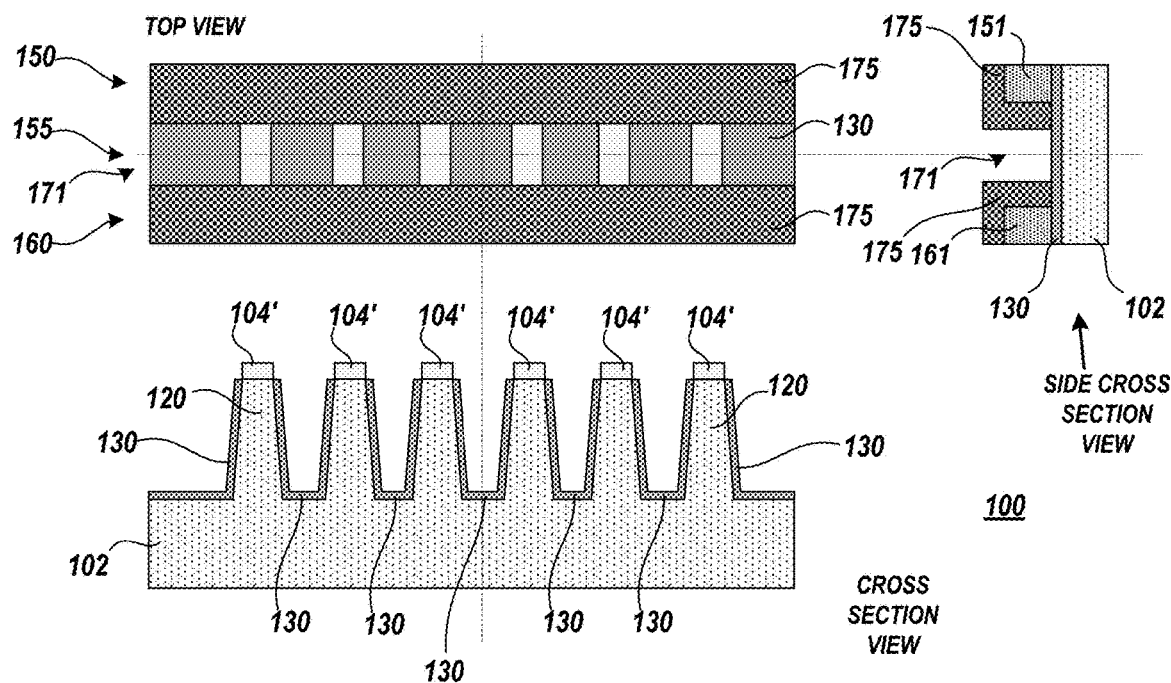

Referring now to FIG. 12, depicting semiconductor structure 100 at an intermediate fabrication stage. At the present fabrication stage, mask layer 175 is formed upon the 2D layer 130 in channel region 155 (not shown), upon source contact 151, and upon drain contact 161. Mask layer 175 is formed from a material that may be etched from structure 100 without damage to the underlying 2D layer 130, without damage to the source contact 151, and without damage to drain contact 161. For example, the mask layer 175 may be spun on negative tone resist such as KemLab 1600, a positive tone resist with a lift-off resist underlayer such as LOR or PMGI, or an image reversal resist such AZ 5215E, or the like.

The portion of mask layer 175 upon 2D layer 130 within channel region 155 is subsequently removed forming a channel well 171. The removal of portions of mask layer 175 may be achieved by lithographic exposure of the mask layer 175 and subsequent development techniques where a developer such as TMAH removes the material of mask layer 175 from the channel region 155 while retaining the 2D layer 130 within the channel region 155, while also retaining the mask layer 175 material upon source contact 151 and upon drain contact 161. The retained mask layer 175 material upon source contact 151 and upon drain contact 161 is herein referred to as source/drain mask 175. Additional appropriate developers for any given resist used to achieve selective removal of portions of mask layer 175 from channel region 155 to form the channel well 171 are generally known in the art.

Figure 13A:
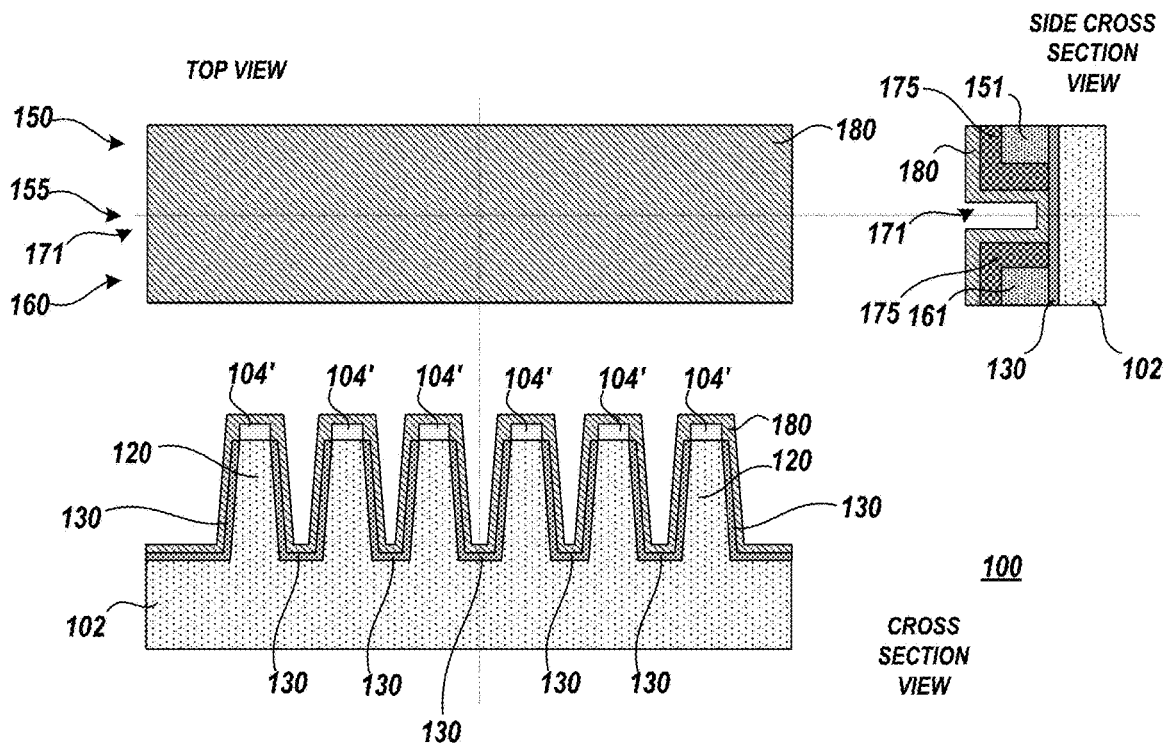
FIG. 13A and FIG. 13B illustrate fabrication stages of a semiconductor structure that includes a fin having 2D material sidewalls, according to exemplary embodiments of the present invention.
Figure 13B:
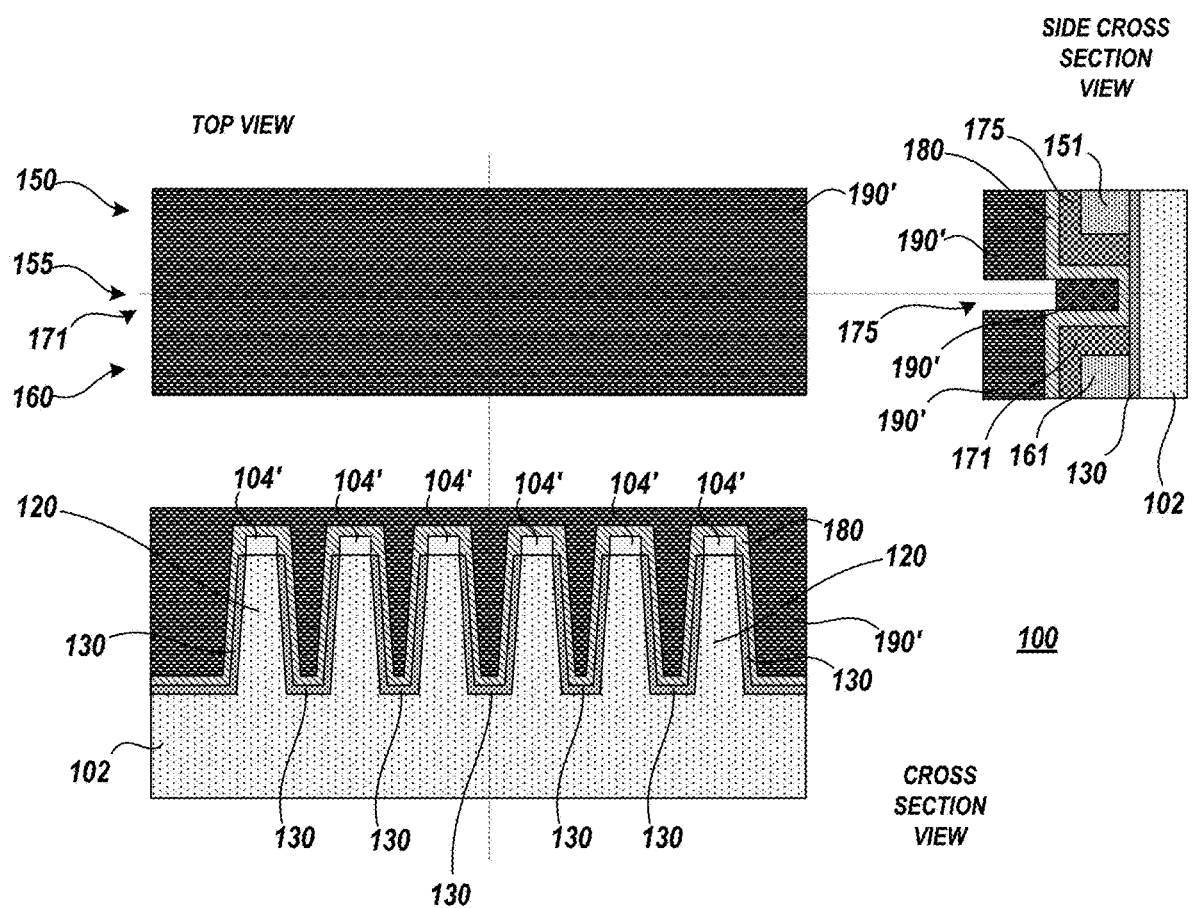

Referring now to FIG. 13A and/or to FIG. 13B, depicting semiconductor structure 100 at intermediate fabrication stages. At the present fabrication stages, gate dielectric layer 180 is formed upon the 2D layer 130 and upon fin caps 104' in channel region 155 and upon the source/drain mask 175, and gate layer 190' is formed upon gate dielectric layer 180.

As shown in FIG. 13A, gate dielectric layer 180 is formed upon the 2D layer 130 and upon fin caps 104' in channel region 155 and upon the source/drain mask 175 in source region 150 and in drain region 160. Gate dielectric layer 180 may be formed from a known gate dielectric material, such as Aluminum Oxide, or the like. For example, the gate dielectric layer 180 may be deposited upon the 2D layer 130 and fin caps 104' in channel region 155 and upon the source/drain mask 175 utilizing Atomic Level Deposition (ALD) techniques. The gate dielectric layer 180 may be formed from a high k dielectric material having a greater dielectric constant as compared to silicon dioxide, using any of several known methods, for example, thermal or plasma oxidation or nitridation methods, chemical vapor deposition methods, and physical vapor deposition methods.

As shown in FIG. 13B, gate layer 190' may be formed upon the gate dielectric layer 180. Gate layer 190' is formed by any suitable deposition technique, including but not limited to atomic layer deposition, chemical vapor deposition, physical vapor deposition, sputtering, plating, etc. For example, gate layer 190' may be formed by an evaporated metal such as Al or Pd. Generally, the portion of gate layer 190' within the channel well 171 that is retained is herein referred to as gate 190. The portions of the gate layer 190' not in the channel well 171 are removed. The portions of the gate layer 190' not in the channel well 171 may be removed by known removal techniques such as CMP techniques, lithographic techniques, or the like.

The portions of gate dielectric layer 180 upon the source/drain mask 175 are also removed while the portion of gate dielectric layer 180 upon 2D layer 130 and fin caps 104' within the channel well 171 are retained underneath the gate 190. The removal of portions of dielectric layer 180 may be achieved by lithographic exposure of the mask layer 180 and subsequent development techniques where a developer such as TMAH removes the material of dielectric layer 180 from the source/drain mask 175 while retaining the dielectric layer 180 upon the 2D layer 130 and upon the fin caps 104' within the channel well 171. Additional appropriate developers for any given resist used to achieve selective removal of portions of gate dielectric layer 180 to form the gate dielectric 180 are generally known in the art. In such technique, the source/drain mask is subsequently removed.

The removal of portions of dielectric layer 180 may be alternatively achieved by subtractive etching techniques where an etchant removes the material of source/drain mask 175 while resultantly also removing the portions of dielectric layer 180 upon the source/drain mask 175.

Generally, the portion of dielectric layer 180 that remains within the channel well 171 is herein referred to as gate dielectric 180'.

Figure 14:
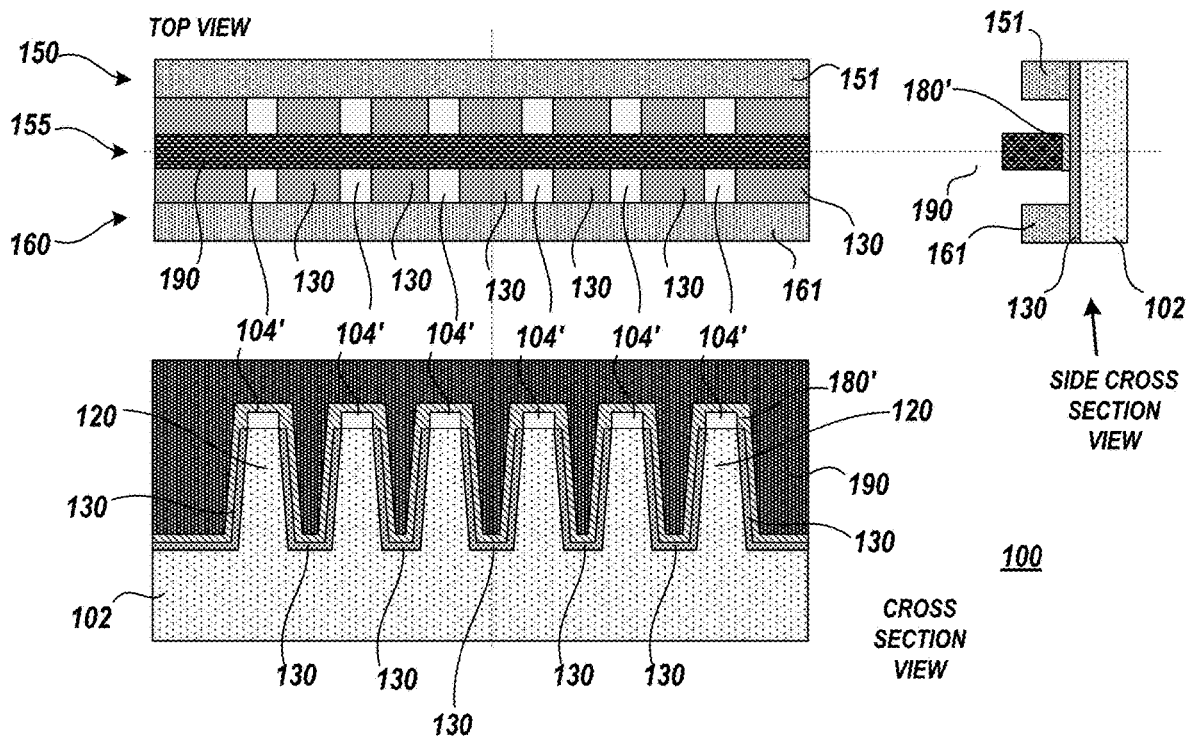
FIG. 14-FIG. 16 illustrate semiconductor structure that includes a fin having 2D material sidewalls, according to one or more exemplary embodiments of the present invention.

Referring now to FIG. 14, depicting semiconductor structure 100 at an intermediate fabrication stage. At the present fabrication stage, gate 190 has been formed upon the gate dielectric 180' by retaining gate 190 from the gate layer 190' and by retaining gate dielectric 180' from dielectric layer 180 and removing the respective undesired portions of gate layer 190' and dielectric layer 180.

Figure 17:
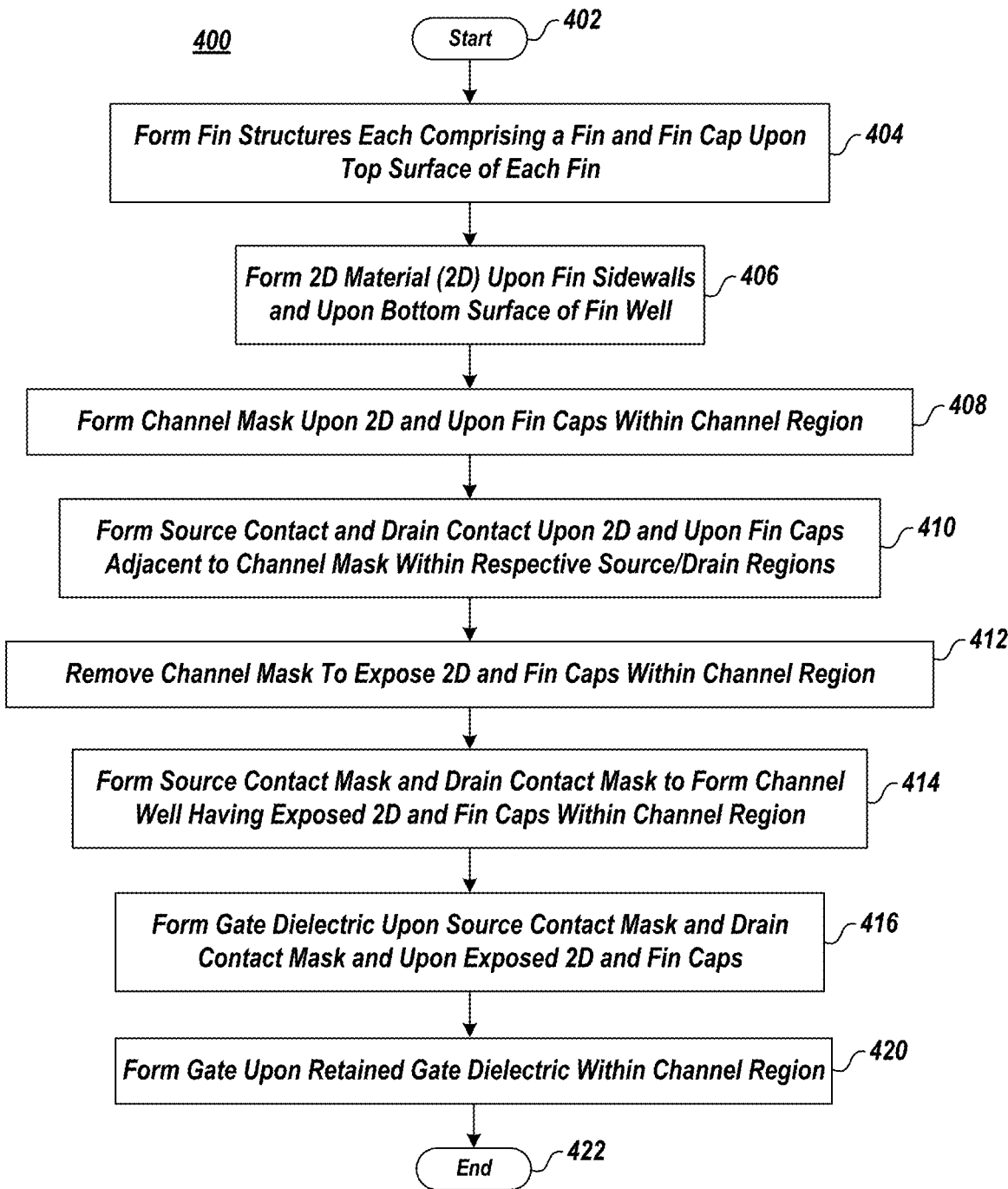
FIG. 17-FIG. 19 illustrate fabrication methods of a semiconductor structure that includes a fin having 2D material sidewalls, according to exemplary embodiments of the present invention.

The presented fabrication flow, also depicted as fabrication method 400 in FIG. 17, results in structure 100 including a layer of 2D material 130 on the sidewalls of fins 120 and upon the bottom surface of fin wells 121 within the source region 150, within drain region 160, and within the channel region 155 underneath gate 190. In such described flow, structure 100 includes fin caps 104' upon each fin 120 so that 2D material 130 is not formed above the top surface of each fin 120.

Figure 15:
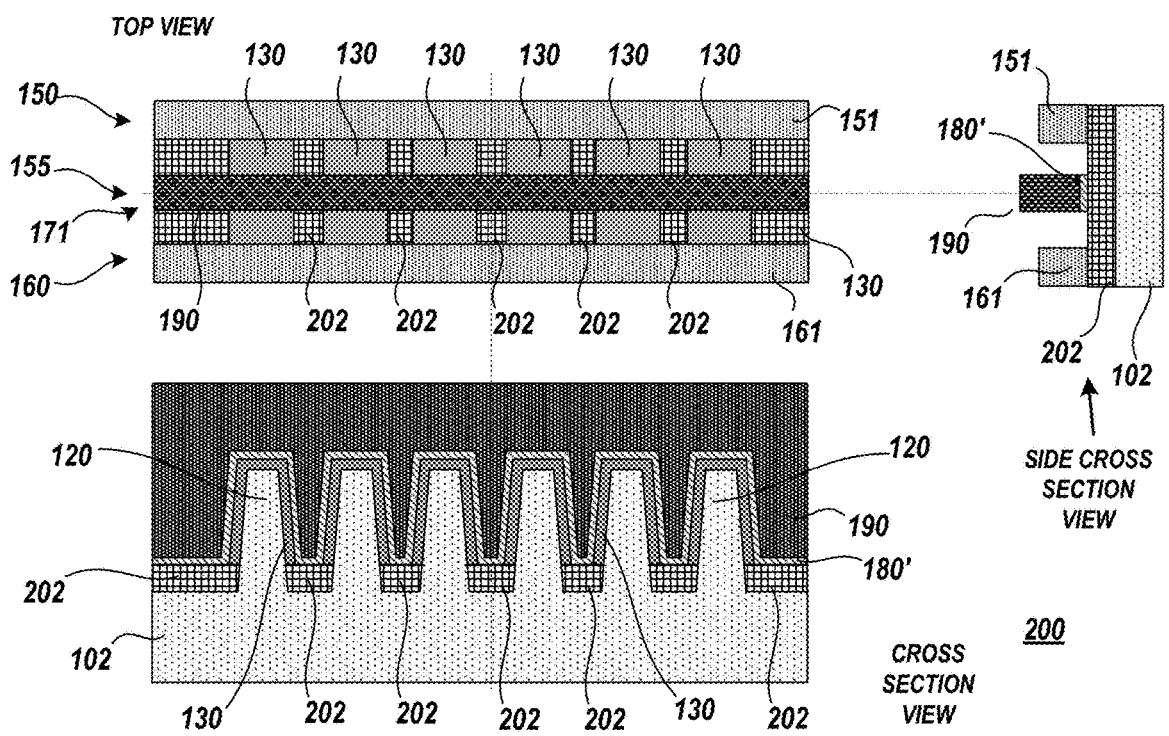

Referring now to FIG. 15, depicting a semiconductor structure 200. In the present embodiment, structure 200 includes 2D layer 130 upon the sidewalls and upper surface of fins 120 within the source region 150, within drain region 160, and within the channel region 155 underneath gate 190. Structure 200 may be formed by fabrication method 500, depicted in FIG. 18. In such described flow, structure 200 includes well-plugs 202 at the bottom of fin wells 121 so that 2D material 130 is not upon the substrate 102 surface at the bottom of the fin wells 121.

Figure 16:
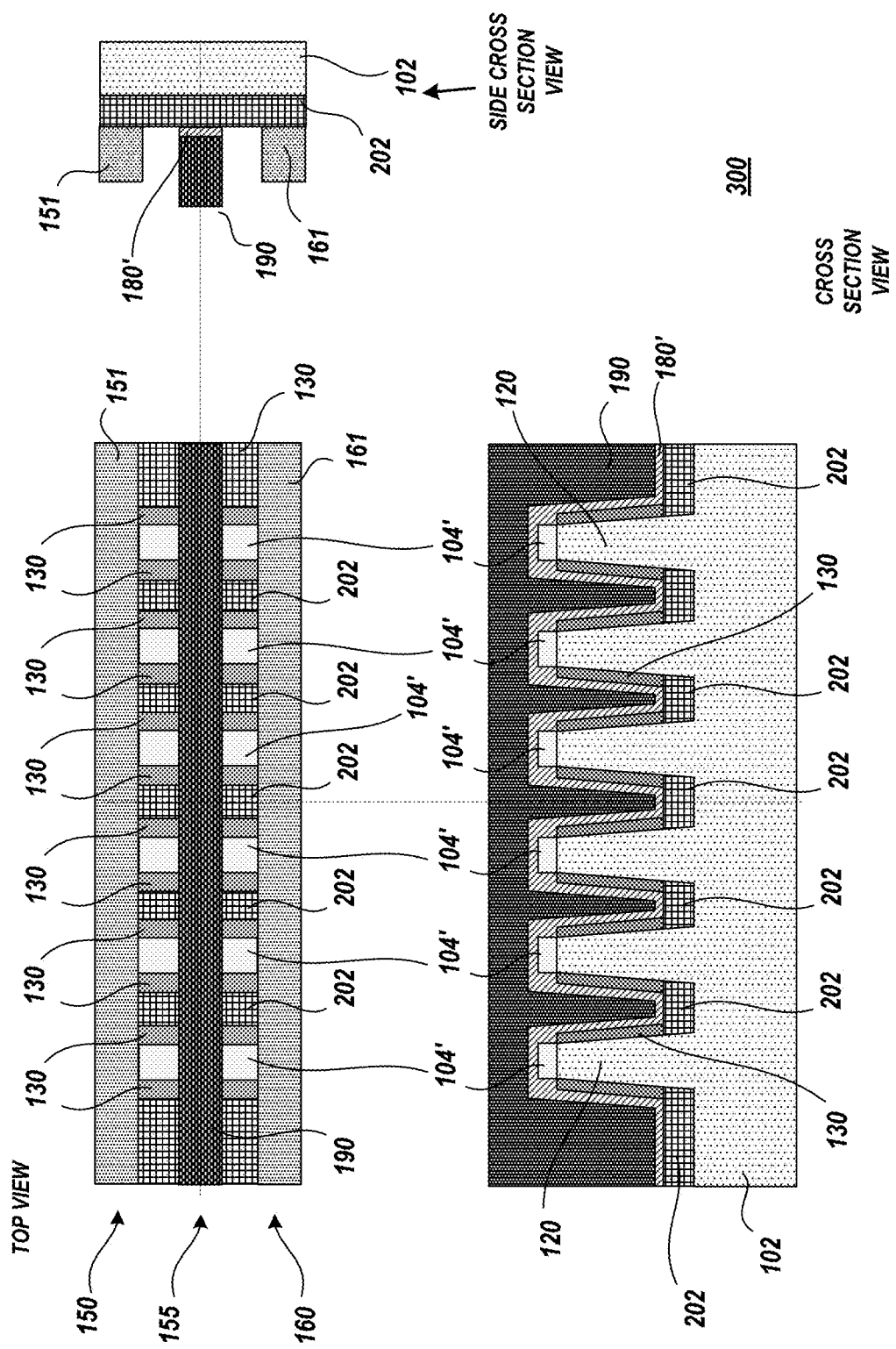

Referring now to FIG. 16, depicting a semiconductor structure 300. In the present embodiment, structure 300 includes 2D layer 130 only upon the sidewalls of fins 120 within the source region 150, within drain region 160, and within the channel region 155 underneath gate 190. Structure 300 may be formed by fabrication method 600, depicted in FIG. 19. In such described flow, structure 300 includes well-plugs 202 at the bottom of fin wells 121 so that 2D material 130 is not upon the substrate 102 surface at the bottom of the fin wells 121. Structure 300 also includes fin caps 104' upon the top surface of each fin 120 so that 2D material 130 is not formed above the top surface of each fin 120. As such, 2D material 130 is only formed upon the sidewalls of each fin 120.

FIG. 17 illustrates fabrication method 400 of semiconductor structure 100 that includes a fin 120 having 2D material 130 sidewalls. Method 400 begins at block 402 and continues with forming fin structures within substrate 102 (block 404). Each fin structure includes a fin 120 and a fin cap 104' upon the top surface of the fin 120. The fins 120 may be formed by fabrication techniques depicted in FIG. 1-FIG. 6 and associated text.

Method 400 may continue with forming 2D layer 130 upon the fin 120 sidewalls and upon the bottom surface of the fin well 121 (block 406). For example, a graphene layer is formed upon the fin 120 sidewalls and the bottom surface of fin wells 121.

Method 400 may continue with forming a channel mask 140 upon the 2D layer 130 and upon fin caps 104' within channel region 155 (block 408). Forming the channel mask 140 may include forming a blanket layer and removing portions of the blanket layer in source region 150 and in drain region 160, such that a remaining portion of the blanket layer in channel region 155 form channel mask 140.

Method 400 may continue with forming a source contact 151 and forming a drain contact 161 upon the 2D layer 130 and upon fin caps 104' adjacent to the channel mask 140 within source region 150 and within drain region 160, respectively (block 410). The source contact 151 and drain contact 161 may be formed by depositing source/drain material 170 upon the channel mask 140 and upon the 2D material 130 and fin caps 104' in source region 150 and drain region 160. The source/drain material 170 in source region 150 and in drain region 160 may generally form source contact 151 and forms drain contact 161, respectively.

Method 400 may continue with removing the channel mask 140 to expose 2D material layer 130 and fin caps 104' within channel region 155 (block 412). The removal of channel mask 140 may also remove with it excess source/drain layer 170 there above.

Method 400 may continue with forming source contact mask 175 and drain contact mask 175 thereby forming channel well 171 having exposed 2D layer 130 and fin caps 104' within channel region 155 (block 414). The contact mask 175 may be formed by depositing a mask material that may be removed without damage to the underlying 2D layer 130 and without damage to the underlying fin caps 104' within channel region 155 and upon the source contact 151 and drain contact 161. Subsequently, the mask material may be removed within the channel region 155 thereby forming channel well 171 and the mask material covering the source contact 151 and drain contact 161 is retained. In embodiments, the geometry of channel well 171 may be chosen to result in the desired geometry of gate 190 that may be formed therewithin.

Method 400 may continue with forming gate dielectric layer 180 upon the source contact mask and the drain contact mask and upon the exposed 2D layer 130 and fin caps 104' within channel well 171 (block 416). A retained gate dielectric 180' may be formed by removing some portions of gate dielectric layer 180 material that are not upon the bottom surfaces of channel well 171 within channel region 155.

Method 400 may continue with forming gate 190 upon the retained gate dielectric 180' (block 420). Method 400 ends at block 422.

Figure 18:
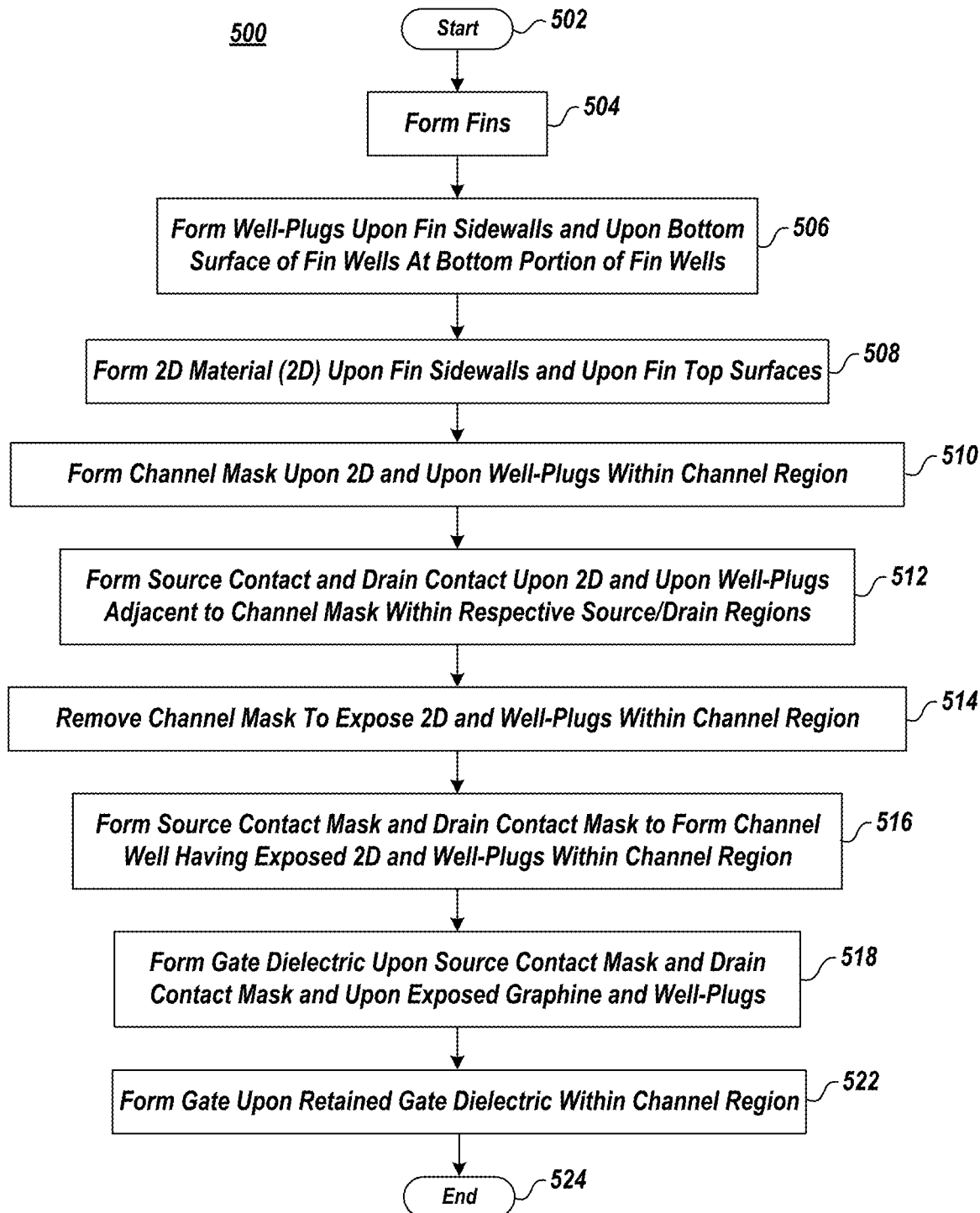

FIG. 18 illustrates fabrication method 500 of semiconductor structure 200 that includes a fin 120 having 2D material 130 sidewalls. Method 500 begins at block 502 and continues with forming fin structures within substrate 102 (block 504). Each fin structure includes a fin 120. The fins 120 may be formed by similar fabrication techniques depicted in FIG. 1-FIG. 6 and associated text. However, the fabrication of structure 200 may not utilize fin cap layer 104. As such, the fins 120 may not include fin caps 104' thereupon.

Method 500 may continue with forming well-plugs 202 at the bottom of fin wells 121 upon the bottom surface of fin wells 121 and upon a lower portion of the sidewalls of fins 120 (block 506). For example, a dielectric layer such as an oxide material layer may be deposited upon the fins 120 and within the fin wells 121 and a subtractive removal technique may remove excess dielectric material from upon the fins 120 and from the upper portion of the fin wells 121 leaving dielectric material within the lower portion of fin wells 121.

Method 500 may continue with forming 2D layer 130 upon the fin 120 sidewalls and fin 120 upper surface (block 508). For example, a graphene layer is formed upon the fin 120 sidewalls and the fin 120 upper surface within the source region 150, drain region 160, and within the channel region 155. The 2D layer 130 is generally not formed upon the upper surface of well-plugs 202 and as such, the upper surface of well plugs are substantially (e.g., the majority, or the like) exposed.

Method 500 may continue with forming a channel mask 140 upon the 2D layer 130 and upon well-plugs 202 within channel region 155 (block 510). Forming the channel mask 140 may include forming a blanket layer upon the 2D layer 130 and well-plugs 202 and removing portions of the blanket layer in source region 150 and in drain region 160, such that a remaining portion of the blanket layer in channel region 155 forms channel mask 140.

Method 500 may continue with forming a source contact 151 and forming a drain contact 161 upon the 2D layer 130 and upon well-plugs 202 adjacent to the channel mask 140 within source region 150 and within drain region 160, respectively (block 512). The source contact 151 and drain contact 161 may be formed by depositing source/drain material 170 upon the channel mask 140 and upon the 2D material 130 and well-plugs 202 in source region 150 and drain region 160. The source/drain material 170 in source region 150 and in drain region 160 may generally form source contact 151 and forms drain contact 161, respectively.

Method 500 may continue with removing the channel mask 140 to expose 2D material layer 130 and well-plugs 202 within channel region 155 (block 514). The removal of channel mask 140 may also remove with it excess source/drain layer 170 material there above.

Method 500 may continue with forming source contact mask 175 and drain contact mask 175 thereby forming channel well 171 having exposed 2D layer 130 and well-plugs 202 within channel region 155 (block 516). The contact mask 175 may be formed by depositing a mask material that may be removed without damage to the underlying 2D layer 130 and without damage to the underlying well-plugs 202 within channel region 155 and depositing the mask material upon the source contact 151 and drain contact 161. Subsequently, the mask material may be removed within the channel region 155 thereby forming channel well 171 and the mask material covering the source contact 151 and drain contact 161 is retained. In embodiments, the geometry of channel well 171 may be chosen to result in the desired geometry of gate 190 that may be formed therewithin.

Method 500 may continue with forming gate dielectric layer 180 upon the source contact mask 175 and the drain contact mask 175 and upon the exposed 2D layer 130 and well-plugs 202 within channel well 171 (block 518). A retained gate dielectric 180' may be formed by removing portions of the gate dielectric layer 180 material that are not upon the bottom surfaces of channel well 171 within channel region 155.

Method 500 may continue with forming gate 190 upon the retained gate dielectric 180' (block 522). Method 500 ends at block 524.

Figure 19:
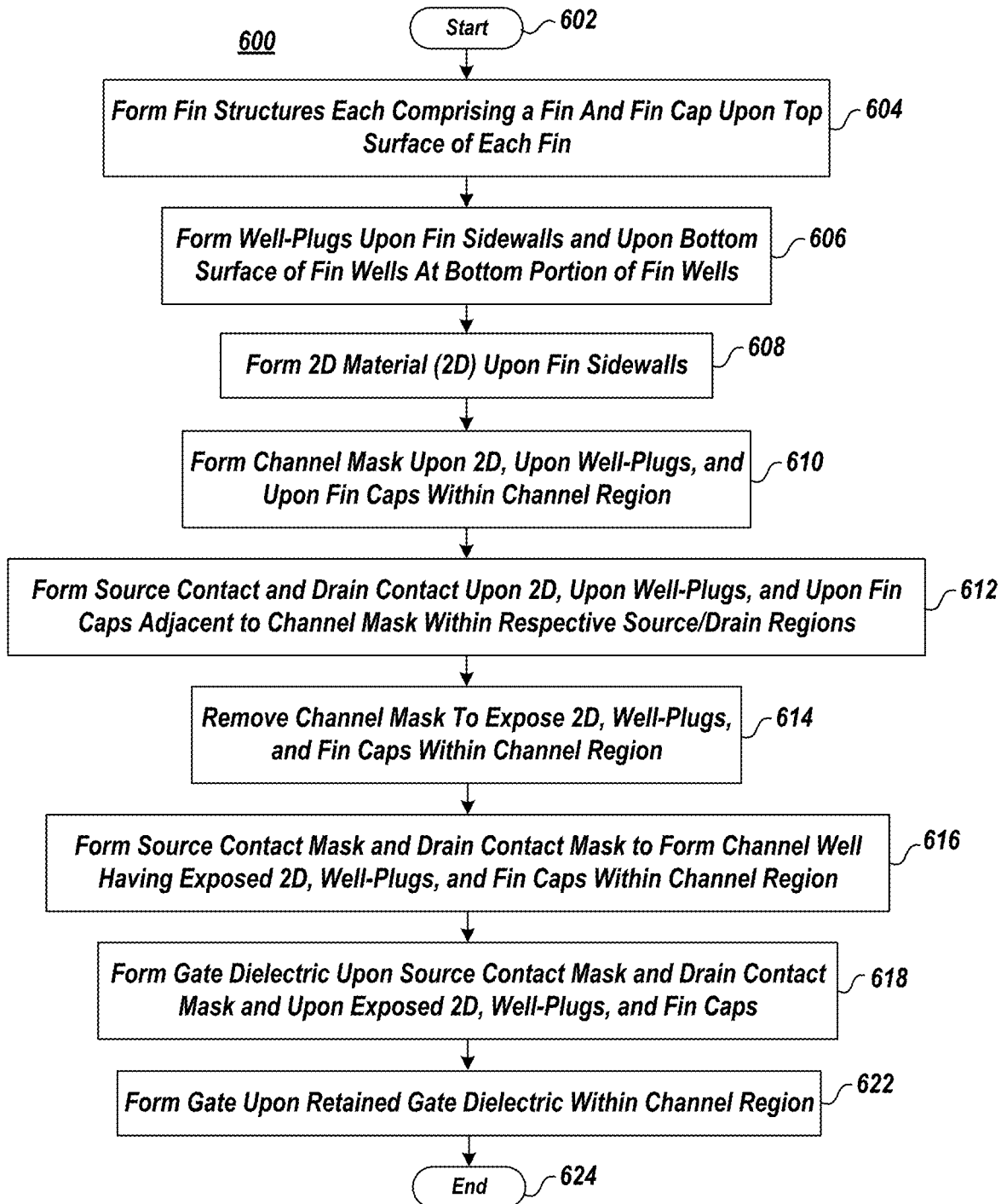

FIG. 19 illustrates fabrication method 600 of semiconductor structure 300 that includes a fin 120 having 2D material 130 sidewalls. Method 600 begins at block 602 and continues with forming fin structures within substrate 102 (block 604). Each fin structure includes a fin 120 and a fin cap 104' upon the top surface of the fin 120. The fins 120 may be formed by similar fabrication techniques depicted in FIG. 1-FIG. 6 and associated text.

Method 600 may continue with forming well-plugs 202 at the bottom of fin wells 121 upon the bottom surface of fin wells 121 and upon a lower portion of the sidewalls of fins 120 (block 606). For example, a dielectric layer such as an oxide material layer may be deposited upon the fins 120 and within the fin wells 121 and a subtractive removal technique may remove excess dielectric material from upon the fins 120 and from the upper portion of the fin wells 121, leaving dielectric material within the lower portion of fin wells 121.

Method 600 may continue with forming 2D layer 130 upon the fin 120 sidewalls (block 608). For example, a graphene layer is formed upon the fin 120 sidewalls within the source region 150, drain region 160, and within the channel region 155. The 2D layer 130 is generally not formed upon the upper surface of well-plugs 202 nor is formed upon the fin caps 104', and as such, the upper surface of well plugs and the fin caps 104' are substantially (e.g., the majority, or the like) exposed and the 2D layer 130 is deposited only upon the sidewalls of fins 120.

Method 600 may continue with forming a channel mask 140 upon the 2D layer 130, upon the fin caps 104', and upon well-plugs 202 within channel region 155 (block 610). Forming the channel mask 140 may include forming a blanket layer upon the 2D layer 130, upon the fin caps 104', and upon the well-plugs 202 and removing portions of the blanket layer in source region 150 and in drain region 160, such that a remaining portion of the blanket layer in channel region 155 forms channel mask 140.

Method 600 may continue with forming a source contact 151 and forming a drain contact 161 upon the 2D layer 130, upon fin caps 104', and upon well-plugs 202 adjacent to the channel mask 140 within source region 150 and within drain region 160, respectively (block 612). The source contact 151 and drain contact 161 may be formed by depositing source/drain material 170 upon the channel mask 140, upon the fin caps 104', upon the 2D material 130, and upon well-plugs 202 in source region 150 and drain region 160. The source/drain material 170 in source region 150 and in drain region 160 may generally form source contact 151 and forms drain contact 161, respectively.

Method 600 may continue with removing the channel mask 140 to expose 2D material layer 130, fin caps 104', and well-plugs 202 within channel region 155 (block 614). The removal of channel mask 140 may also remove with it excess source/drain layer 170 material there above.

Method 600 may continue with forming source contact mask 175 and drain contact mask 175 thereby forming channel well 171 having exposed 2D layer 130, fin caps 104', and well-plugs 202 within channel region 155 (block 616). The contact mask 175 may be formed by depositing a mask material that may be removed without damage to the underlying 2D layer 130, without damage to the underlying well-plugs 202, and without damage to the underlying fin caps 104' within channel region 155 and depositing the mask material upon the source contact 151 and drain contact 161. Subsequently, the mask material may be removed within the channel region 155, thereby forming channel well 171, while the mask material covering the source contact 151 and drain contact 161 is retained. In embodiments, the geometry of channel well 171 may be chosen to result in the desired geometry of gate 190 that may be formed therewithin.

Method 600 may continue with forming gate dielectric layer 180 upon the source contact mask 175 and the drain contact mask 175 and upon the exposed 2D layer 130, upon the exposed fin caps 104', and upon the exposed well-plugs 202 within channel well 171 (block 618). A retained gate dielectric 180' may be formed by removing portions of the gate dielectric layer 180 material that is not upon the bottom surfaces of channel well 171 within channel region 155 and removing the source mask 175 and drain mask 175.

Method 600 may continue with forming gate 190 upon the retained gate dielectric 180' (block 622). Method 600 ends at block 624.

FIG. 20-FIG. 23 illustrates fabrication stages of semiconductor structure (e.g. structure 200, structure 300, or the like) that includes a fin having 2D material sidewalls, according to exemplary embodiments of the present invention. More specifically, FIG. 20-FIG. 23 illustrates fabrication stages of a semiconductor structure 300 that includes well-plugs 202. For clarity, similar fabrication stages to those depicted in FIG. 20-FIG. 23 are contemplated to form semiconductor structure 200 and would be depicted without fin caps 104'.

Figure 20:
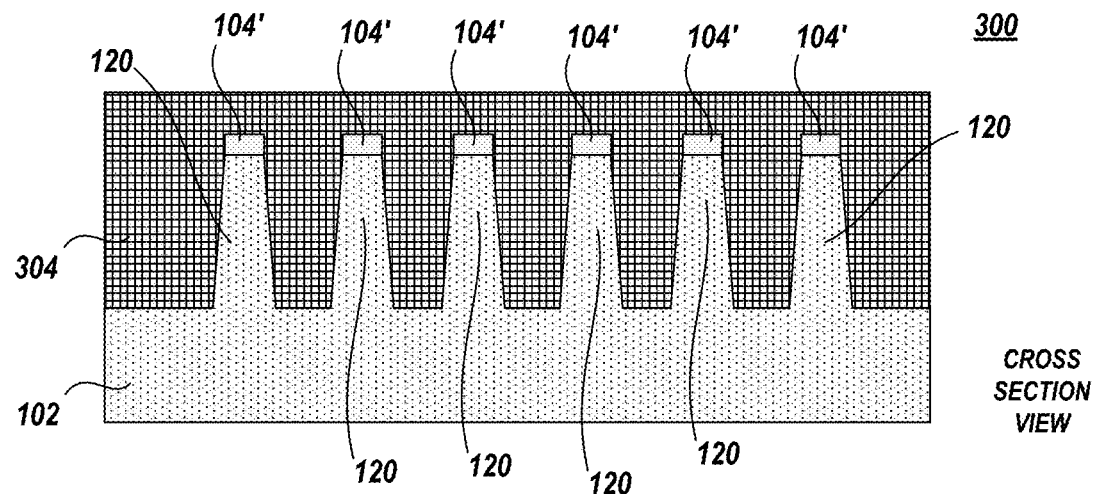
FIG. 20-FIG. 23 illustrates fabrication stages of a semiconductor structure that includes a fin having 2D material sidewalls, according to exemplary embodiments of the present invention.

Referring now to FIG. 20, depicting the semiconductor structure at an intermediate fabrication stage. At the present fabrication stage, a high aspect ratio plasma (HARP) oxide layer 304 is formed upon the substrate 102, upon the sidewalls of the fins 120, and upon the fin caps 104' (i.e. structure 300) or is formed upon the substrate 102 and upon the fins 120 (i.e. structure 200). The HARP layer 304 may be formed to a thickness greater than the height of fins 120 and/or greater than the height of the fin caps 104'. In an embodiment, the HARP layer 304 may be formed by depositing silicon oxide and may be subsequently annealed.

Figure 21:
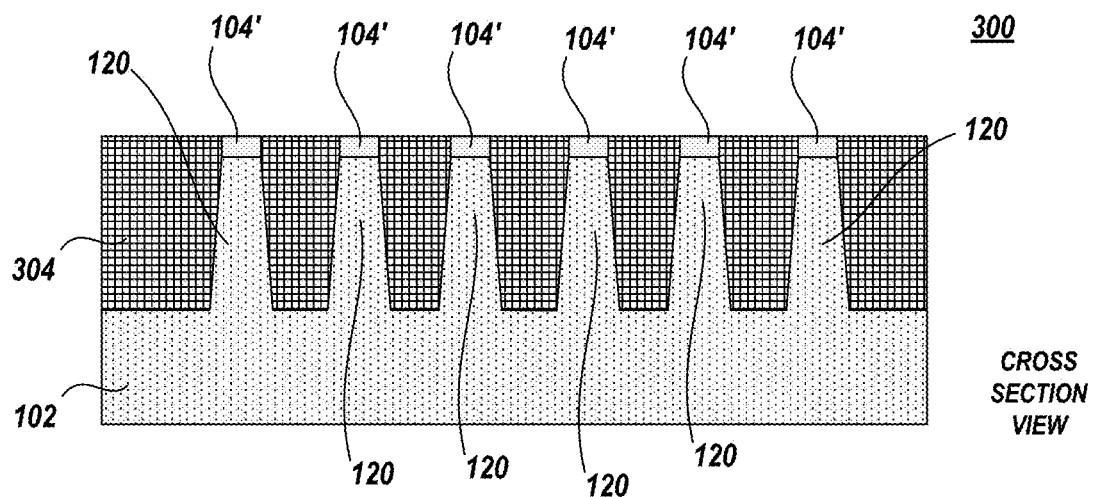

Referring now to FIG. 21, depicting the semiconductor structure at an intermediate fabrication stage. At the present fabrication stage, the structure undergoes a CMP process to remove undesired HARP layer 304 material above the plane of the upper surface of fins 120 (i.e. structure 200) or above the plane of the upper surface of fins caps (structure 300).

Figure 22:
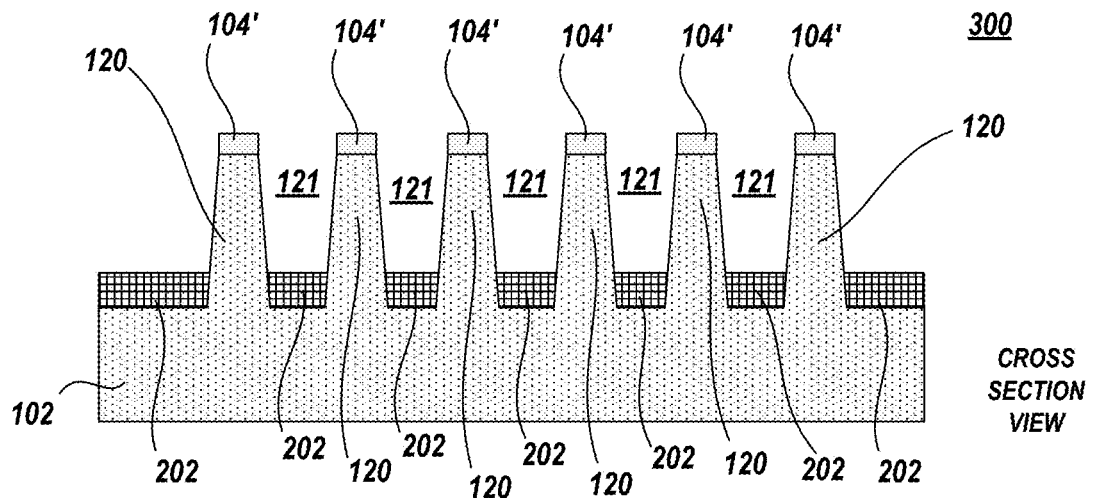

Referring now to FIG. 22, depicting the semiconductor structure at an intermediate fabrication stage. At the present fabrication stage, portions of the HARP layer 304 within fin trenches 121 are removed. The portions of the HARP layer 304 may be removed by subtractive removal techniques. For example, an etchant chosen to remove the material of HARP layer 304 and to not remove the material of substrate 102 and fins 120 and to not remove the material of fin caps 104' (if present) may be used to, for instance, remove portions of HARP layer 304 that are within fin wells 121. The exposure to the etchant may be timed or otherwise applied selectively so as to retain material of HARP layer 304 to form well-plugs 202 at the bottom of the fin wells 121.

Figure 23:
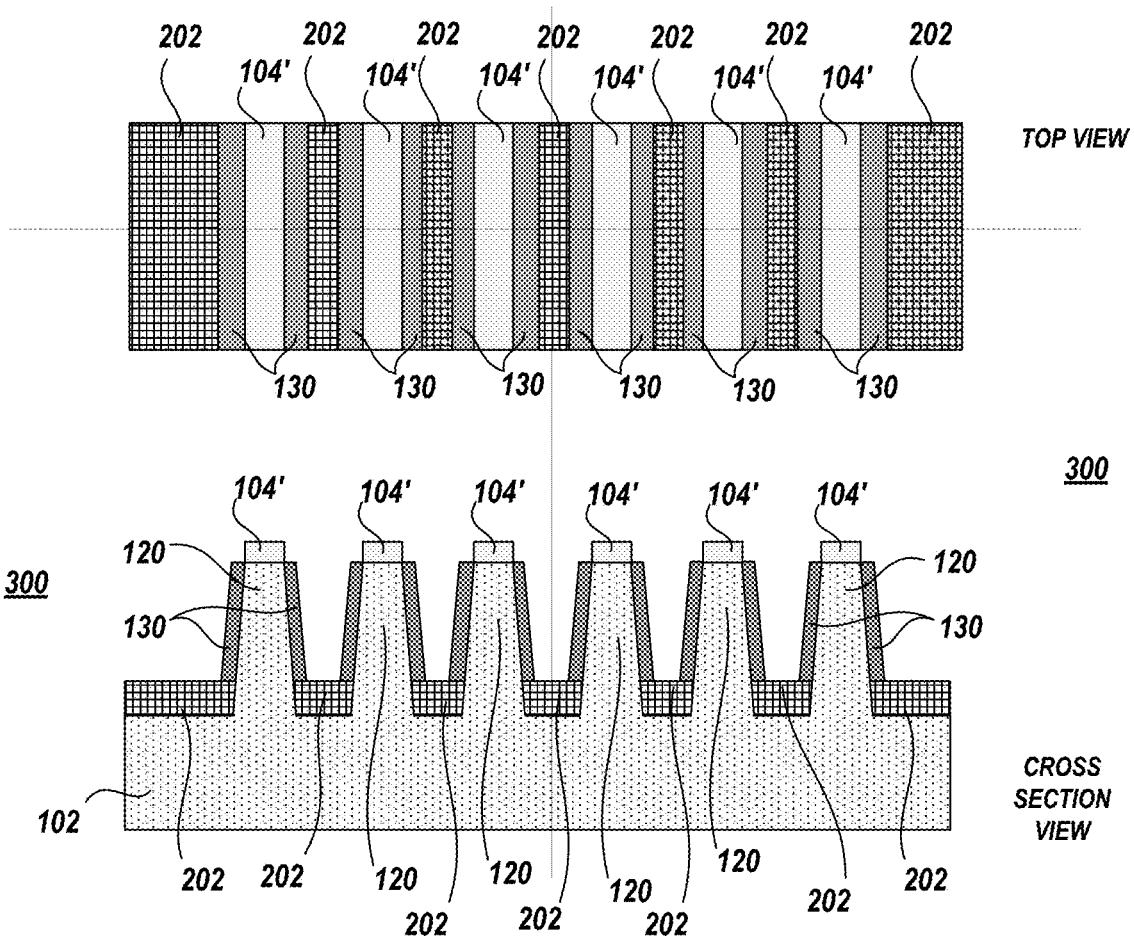

Referring now to FIG. 23, depicting the semiconductor structure at an intermediate fabrication stage. At the present fabrication stage, 2D layer 130 is formed only upon the sidewalls of fins 120 (i.e. structure 300) by forming a 2D material upon the exposed sidewall surfaces of fins 120. At the present fabrication stage, 2D layer 130 may alternatively be formed upon the sidewalls and upper surface of fins 120 (i.e. structure 200) by forming a 2D material upon the exposed sidewall and upper surfaces of fins 120. In embodiments, the particular deposition techniques may be selected to achieve desired thickness of 2D layer 130 in order to control finFET band gap properties. For example, Ar gas is used to achieve slower sublimation of Si from the SiC surface at high temperatures (e.g., 750° C., or the like) to achieve a few monolayers of Graphene in a controlled manner (each Graphene monolayer is about 0.35 nm thick). Similar fabrication stages as those depicted in FIG. 8-FIG. 14 and described by method 500 or method 600 may be subsequently utilized upon the semiconductor structure to form structure 200 or to form structure 300, respectively.

It should be noted that some features of the present invention may be used in an embodiment thereof without use of other features of the present invention. As such, the foregoing description should be considered as merely illustrative of the principles, teachings, examples, and exemplary embodiments of the present invention, and not a limitation thereof. It should also be understood that these embodiments are only examples of the many advantageous uses of the innovative teachings herein. In general, statements made in the specification of the present application do not necessarily limit any of the various claimed inventions. Moreover, some statements may apply to some inventive features but not to others.

The methods as discussed above may be used in the fabrication of integrated circuit chips. The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products (such as, but not limited to, an information processing system) having a display, a keyboard, or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

Unless described otherwise, or in addition to that described herein, "forming," "depositing," "deposited," etc. may include any now known or later developed techniques appropriate for the material to be deposited, including, but not limited to: CVD, LPCVD, PECVD, semi-atmosphere CVD (SACVD), high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic level deposition (ALD), chemical oxidation, molecular beam epitaxy (MBE), plating or evaporation.

References herein to terms such as "vertical", "horizontal", etc. are made by way of example, and not by way of limitation, to establish a frame of reference. The term "horizontal" as used herein is defined as a plane parallel to the conventional plane or surface of the substrate 102, regardless of the actual spatial orientation of the semiconductor substrate 102. The term "vertical" refers to a direction perpendicular to the horizontal, as just defined. Terms, such as "on", "above", "below", "side" (as in "sidewall"), "higher", "lower", "over", "beneath" and "under", are defined with respect to the horizontal plane. It is understood that various other frames of reference may be employed for describing the present invention without departing from the spirit and scope of the present invention.

What is claimed is:

1. A semiconductor structure fabrication method comprising:
    forming a first fin and a second fin within a semiconductor substrate, the first fin and the second fin separated by a fin well, the fin well comprising a first sidewall formed by the first fin, a second sidewall formed by the second fin, and a bottom surface formed by the semiconductor substrate;
    forming a first fin cap upon the first fin and a second fin cap upon the second fin;
    forming a 2D material upon the first sidewall formed by the first fin, upon the second sidewall formed by the second fin, and upon the bottom surface formed by the semiconductor substrate.

2. The method of claim 1, wherein the 2D material is formed as a layer upon the first sidewall formed by the first fin, upon the second sidewall formed by the second fin, and upon the bottom surface formed by the semiconductor substrate and is not formed upon the first fin cap and not formed upon the second fin cap.

3. The method of claim 1, wherein the semiconductor substrate is a Silicon Carbide semiconductor substrate, wherein the first fin is a Silicon Carbide first fin, and wherein the second fin is a Silicon Carbide second fin.

4. The method of claim 1, wherein the 2D material is Graphene.

5. The method of claim 1, wherein forming the first fin, the second fin, the first fin cap, and the second fin cap comprises:
    forming a fin cap layer upon the semiconductor substrate;
    forming a mandrel base layer upon the fin cap layer;
    forming mandrels upon the mandrel base layer;
    forming spacers upon sidewalls of the mandrels;
    forming the mandrels within the spacers;
    forming a fin mask by removing the fin cap layer and the mandrel base layer while retaining the fin cap layer and the mandrel base layer underneath the spacers; and
    forming the first fin, the second fin, the first fin cap, and the second fin cap by removing the fin mask and partially removing exposed portions of substrate not protected by the fin mask while retaining a portion of the fin cap layer upon the upper surface of each formed fin.

6. The method of claim 1, wherein the first fin cap and the second fin cap are formed from a material that which the 2D material does not form thereupon when the 2D material is formed upon the first sidewall of the first fin and upon the second sidewall of the second fin.

7. The method of claim 1, wherein the first sidewall of the first fin is obtusely angled relative to the bottom surface of the fin well.

8. The method of claim 1, wherein the second sidewall of the second fin is obtusely angled relative to the bottom surface of the fin well.

9. A semiconductor structure comprising:
a semiconductor substrate;
a first fin and a second fin within the semiconductor substrate, the first fin and the second fin separated by a fin well, the fin well comprising a first sidewall formed by the first fin, a second sidewall formed by the second fin, and a bottom surface formed by the semiconductor substrate;
a first fin cap upon the first fin and a second fin cap upon the second fin; and
a 2D material upon the first sidewall formed by the first fin, upon the second sidewall formed by the second fin, and upon the bottom surface formed by the semiconductor substrate.

10. The semiconductor structure of claim 9, wherein the 2D material is formed as a layer upon the first sidewall formed by the first fin, upon the second sidewall formed by the second fin, and upon the bottom surface formed by the semiconductor substrate and is not formed upon the first fin cap and not formed upon the second fin cap.

11. The semiconductor structure of claim 9, wherein the semiconductor substrate is a Silicon Carbide semiconductor substrate, wherein the first fin is a Silicon Carbide first fin, and wherein the second fin is a Silicon Carbide second fin.

12. The semiconductor structure of claim 9, wherein the 2D material is Graphene.

13. The semiconductor structure of claim 9, wherein the first fin cap is a Silicon Nitride first fin cap and wherein the second fin cap is a Silicon Nitride second fin cap.

14. The semiconductor structure of claim 9, wherein the first sidewall of the first fin is obtusely angled relative to the bottom surface of the fin well and wherein the second sidewall of the second fin is obtusely angled relative to the bottom surface of the fin well.

15. A finFET comprising:
a semiconductor substrate;
a first fin and a second fin within the semiconductor substrate, the first fin and the second fin separated by a fin well, the fin well comprising a first sidewall formed by the first fin, a second sidewall formed by the second fin, and a bottom surface formed by the semiconductor substrate;
a first fin cap upon the first fin and a second fin cap upon the second fin; and
a 2D material upon the first sidewall formed by the first fin, upon the second sidewall formed by the second fin, and upon the bottom surface formed by the semiconductor substrate.

16. The finFET of claim 15, wherein the 2D material is formed as a layer upon the first sidewall formed by the first fin, upon the second sidewall formed by the second fin, and upon the bottom surface formed by the semiconductor substrate and is not formed upon the first fin cap and not formed upon the second fin cap.

17. The finFET of claim 15, wherein the semiconductor substrate is a Silicon Carbide semiconductor substrate, wherein the first fin is a Silicon Carbide first fin, and wherein the second fin is a Silicon Carbide second fin.

18. The finFET of claim 15, wherein the 2D material is Graphene.

19. The finFET of claim 15, wherein the first fin cap is a Silicon Nitride first fin cap and wherein the second fin cap is a Silicon Nitride second fin cap.

20. The finFET of claim 15, wherein the first sidewall of the first fin is obtusely angled relative to the bottom surface of the fin well and wherein the second sidewall of the second fin is obtusely angled relative to the bottom surface of the fin well.

* * * * *